(12) United States Patent
Coenegracht et al.

(10) Patent No.: US 10,980,141 B2
(45) Date of Patent: Apr. 13, 2021

(54) LATCHING SYSTEM FOR AN ENCLOSURE

(71) Applicant: CommScope Connectivity Belgium BVBA, Kessel-Lo (BE)

(72) Inventors: Philippe Coenegracht, Hasselt (BE); Alexandre Caroline M. De Bie, Beauvechain (BE); Maddy Nadine Frederickx, Aarschot (BE); Paul Joseph Claes, Tremelo (BE); Geert Van Genechten, Vorselaar (BE); Mohamed Aznag, Scherpenheuvel (BE); Diederik Houben, Berbroek (BE)

(73) Assignee: COMMSCOPE CONNECTIVITY BELGIUM BVBA, Kessel-Lo (BE)

( * ) Notice: Subject to any disclaimer, the term of this patent is extended or adjusted under 35 U.S.C. 154(b) by 183 days.

(21) Appl. No.: 15/760,212

(22) PCT Filed: Sep. 14, 2016

(86) PCT No.: PCT/EP2016/071737
§ 371 (c)(1),
(2) Date: Mar. 14, 2018

(87) PCT Pub. No.: WO2017/046187
PCT Pub. Date: Mar. 23, 2017

(65) Prior Publication Data
US 2018/0270977 A1    Sep. 20, 2018

Related U.S. Application Data

(60) Provisional application No. 62/382,566, filed on Sep. 1, 2016, provisional application No. 62/218,350, filed on Sep. 14, 2015.

(51) Int. Cl.
*H05K 5/06* (2006.01)
*H05K 5/00* (2006.01)
*H05K 5/02* (2006.01)

(52) U.S. Cl.
CPC .......... *H05K 5/061* (2013.01); *H05K 5/0004* (2013.01); *H05K 5/0221* (2013.01); *H05K 5/0226* (2013.01); *H05K 5/0247* (2013.01)

(58) Field of Classification Search
CPC ............... B65D 21/0222; B65D 45/16; B65D 2251/1058; H05K 5/061; H05K 5/0226; H05K 5/0247
See application file for complete search history.

(56) References Cited

U.S. PATENT DOCUMENTS

| 4,655,365 A * | 4/1987 | Miller | F16J 13/18 105/377.07 |
| 6,705,650 B2 * | 3/2004 | Ohnishi | F02M 35/0203 292/242 |

(Continued)

FOREIGN PATENT DOCUMENTS

| WO | 2012007904 A1 | 1/2012 |
| WO | 2014/128137 A2 | 8/2014 |

OTHER PUBLICATIONS

International Search Report and Written Opinion of the International Searching Authority for corresponding International Patent Application No. PCT/EP2016/071737 dated Mar. 27, 2017, 17 pages.

*Primary Examiner* — Andrew T Kirsch
(74) *Attorney, Agent, or Firm* — Merchant & Gould P.C

(57) ABSTRACT

Latching system that latches an enclosure having a compressible sealant about its perimeter, the latching system providing for an open configuration, a staged configuration, and a mated configuration, the compressible sealant engaging a pair of projections having a channel therebetween to form a seal having an air gap above the sealant.

19 Claims, 34 Drawing Sheets

(56) References Cited

U.S. PATENT DOCUMENTS

| | | | |
|---|---|---|---|
| 7,603,018 B2 | 10/2009 | Mullaney et al. | |
| 8,272,527 B2* | 9/2012 | Horn .................... | A01C 15/006 |
| | | | 220/324 |
| 2002/0175174 A1* | 11/2002 | Diesterbeck ............ | B65D 1/46 |
| | | | 220/782 |
| 2013/0081849 A1 | 4/2013 | Simmons | |
| 2014/0226945 A1 | 8/2014 | Claessens et al. | |

\* cited by examiner

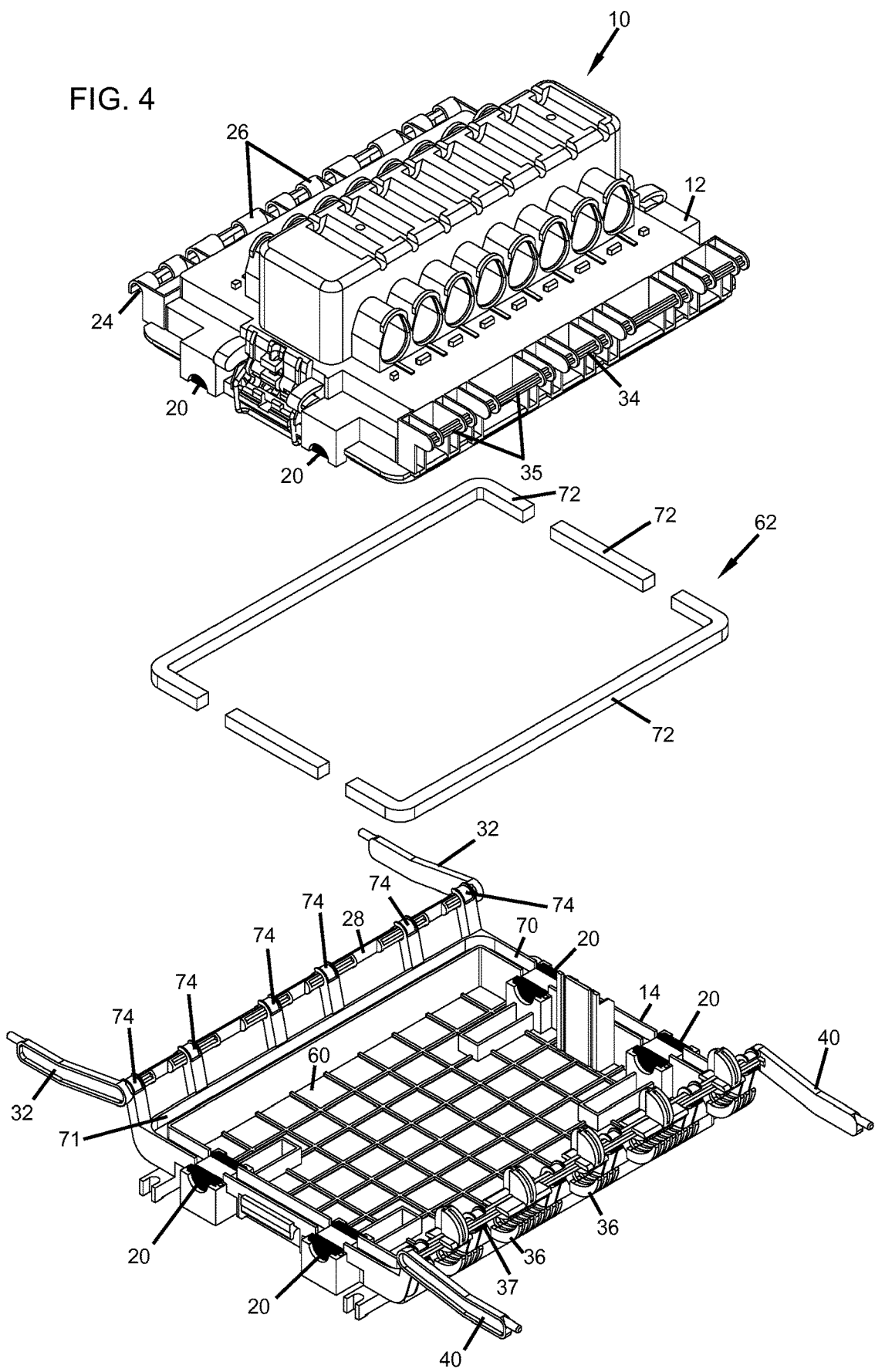

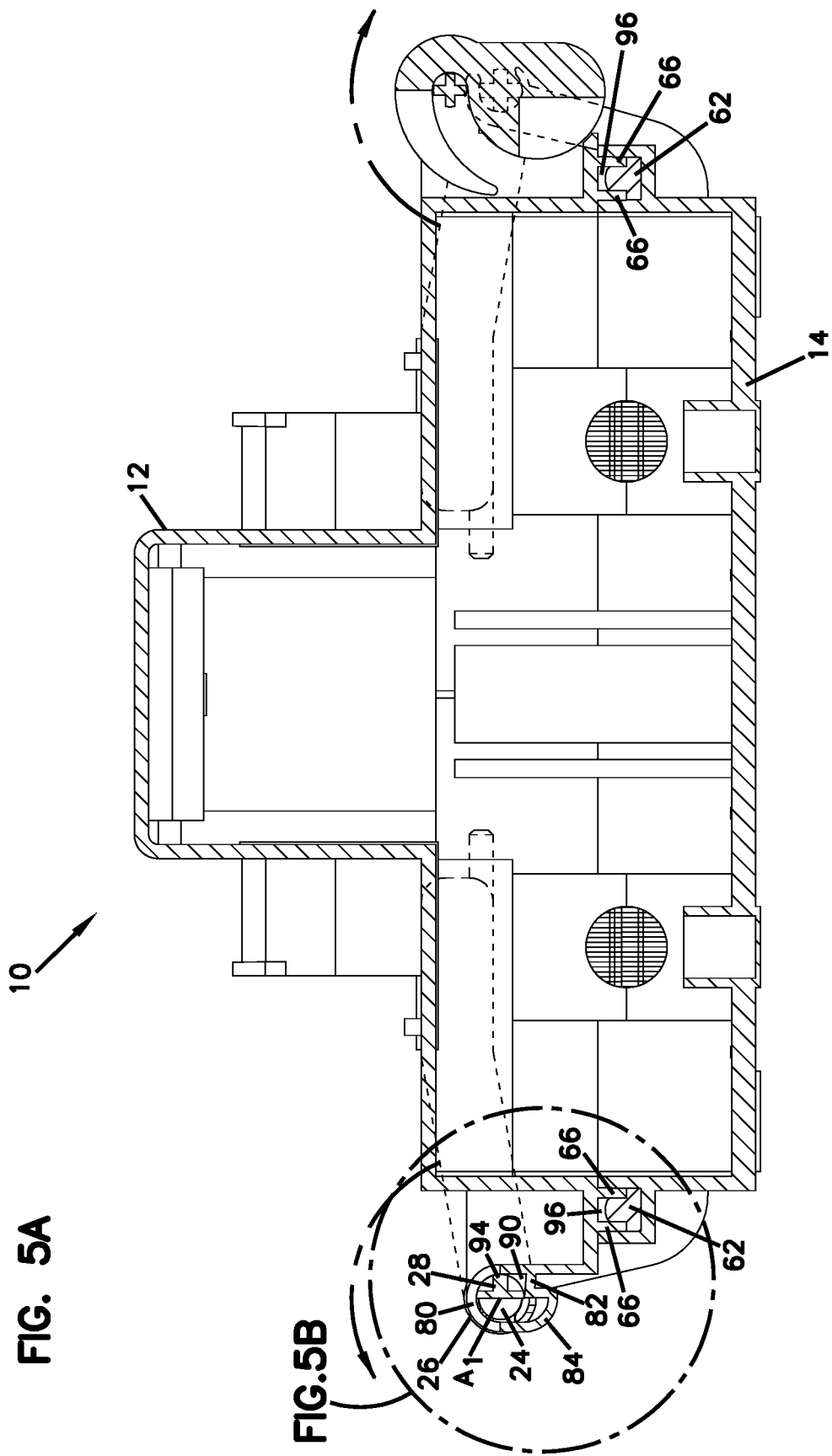

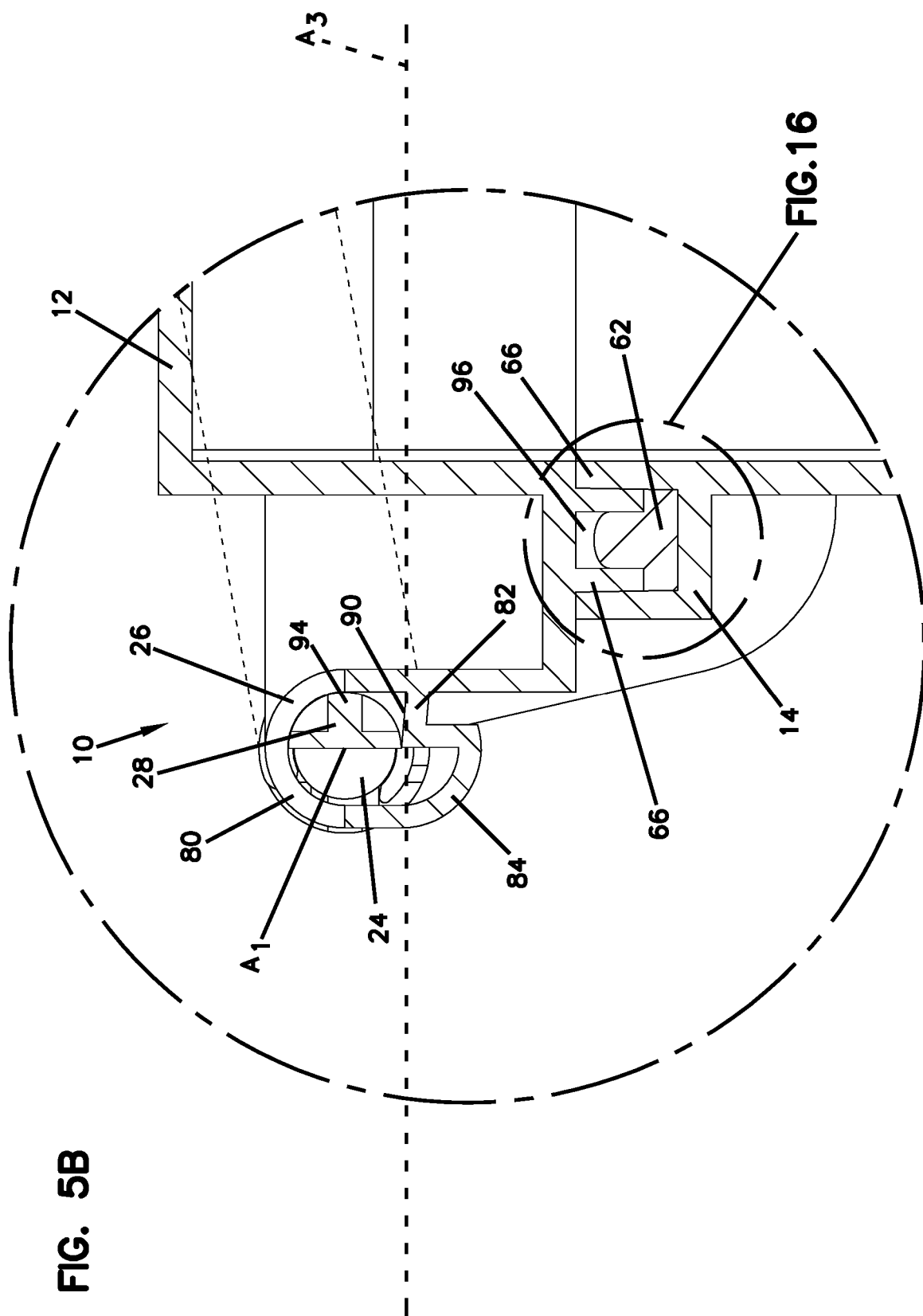

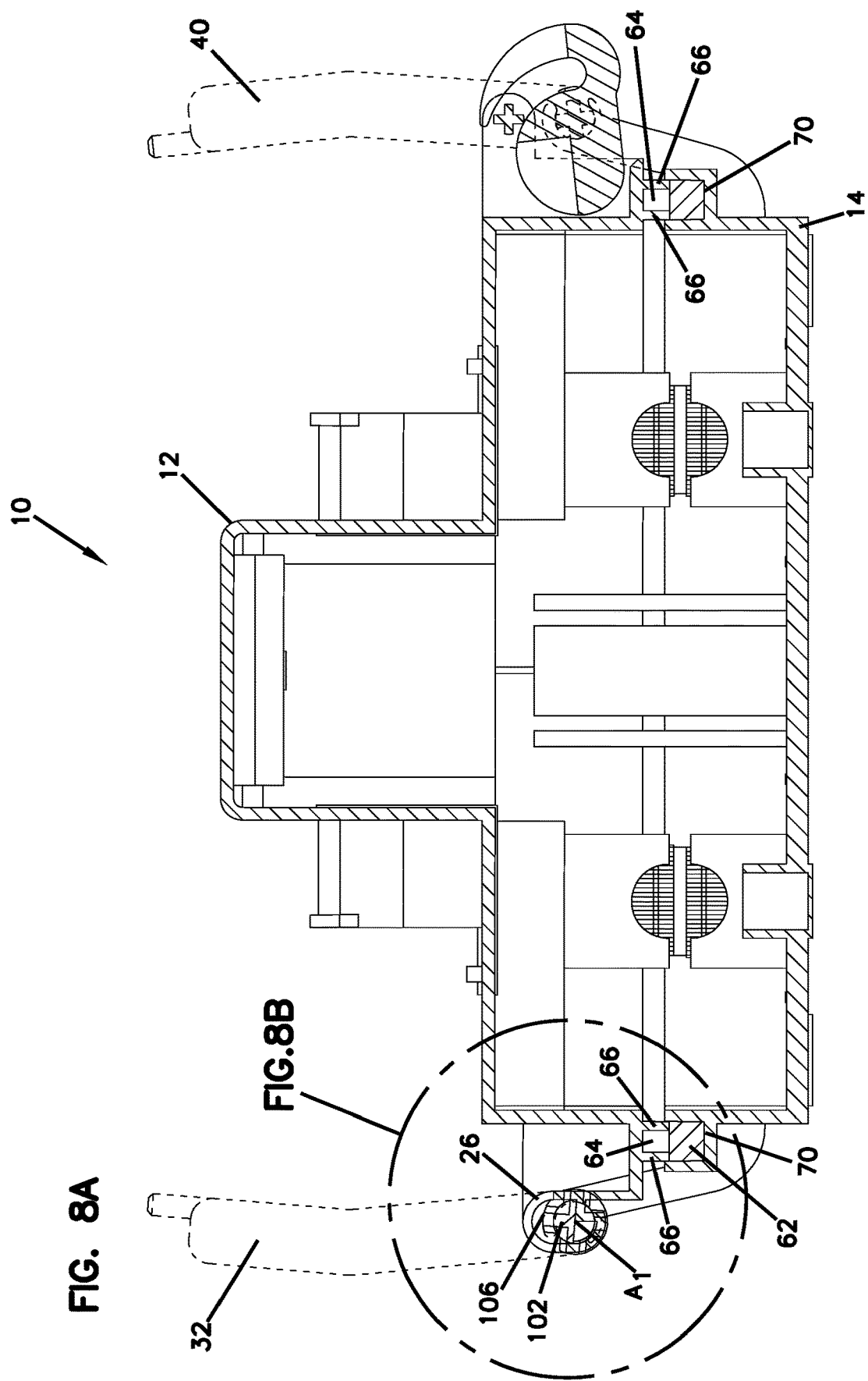

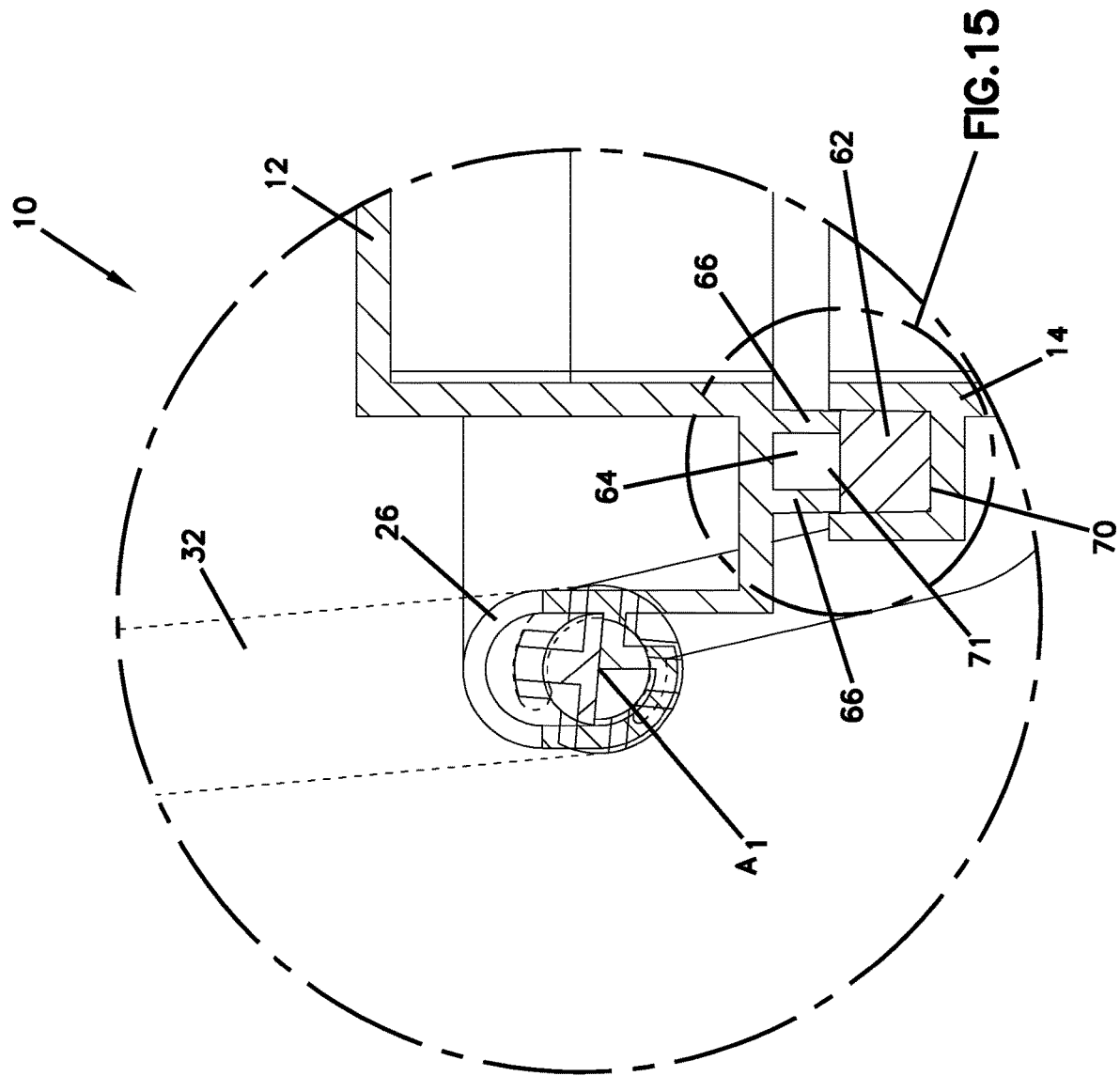

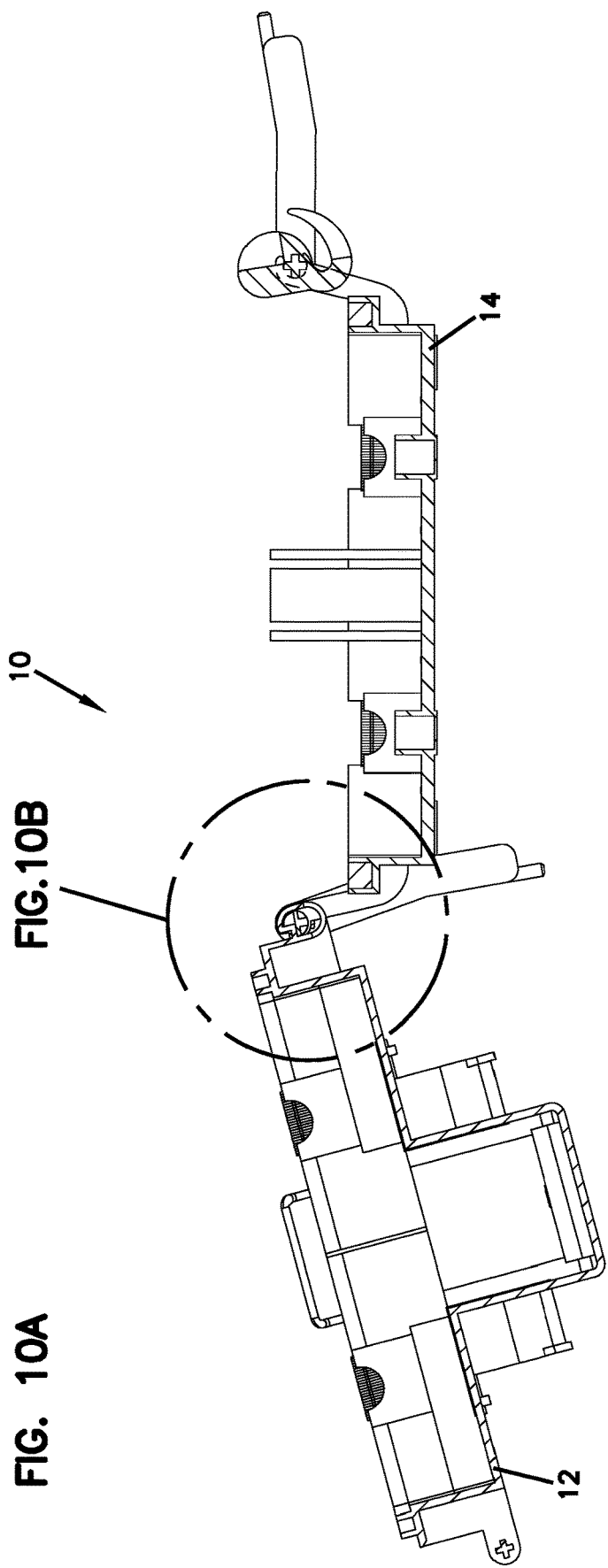

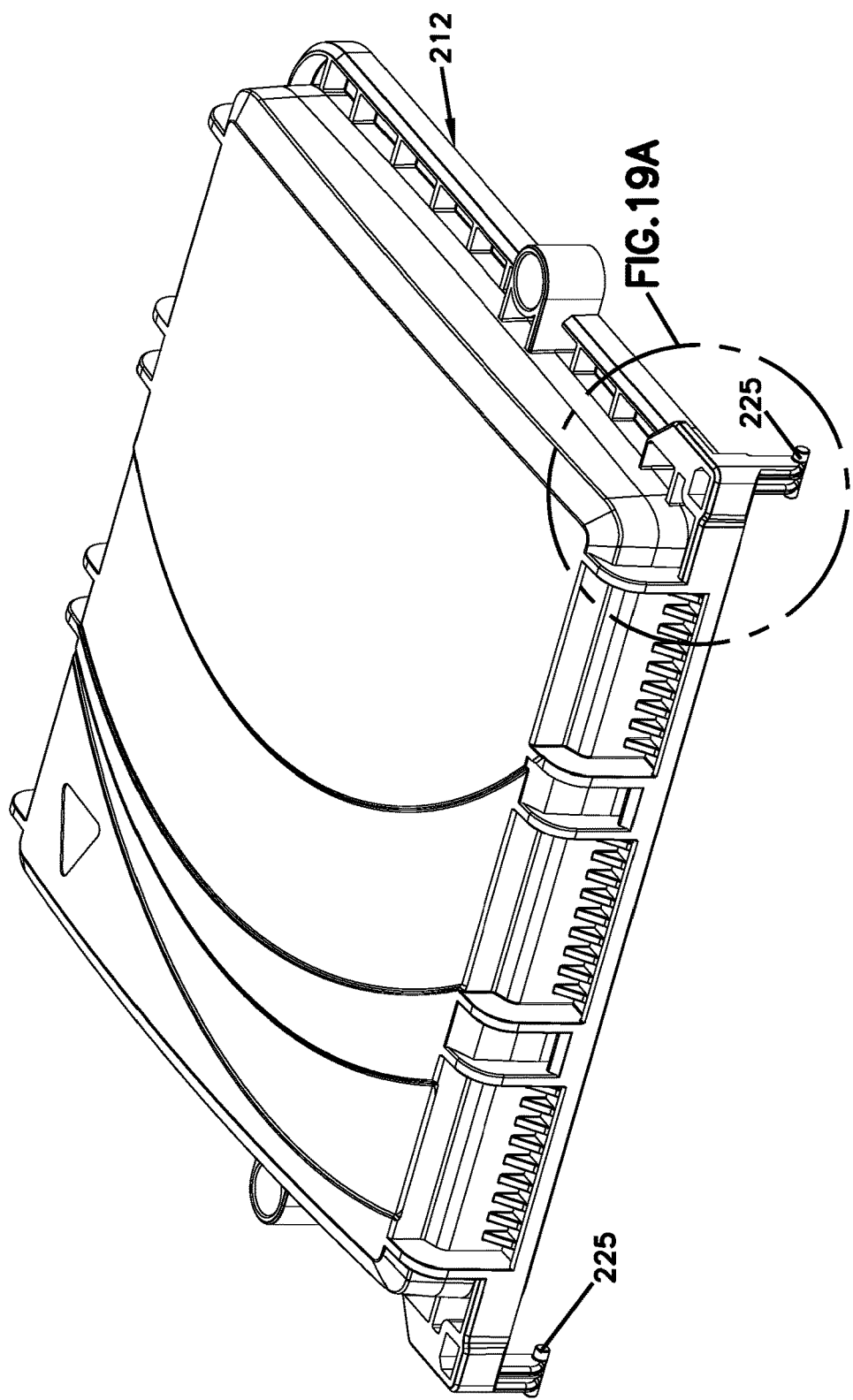

LATCHING SYSTEM FOR AN ENCLOSURE

CROSS-REFERENCE TO RELATED APPLICATIONS

This application is a National Stage Application of PCT/EP2016/071737, filed on Sep. 14, 2016, which claims the benefit of U.S. Patent Application Ser. No. 62/218,350, filed on Sep. 14, 2015, and U.S. Patent Application Ser. No. 62/382,566, filed on Sep. 1, 2016, the disclosures of which are incorporated herein by reference in their entireties. To the extent appropriate, a claim of priority is made to each of the above disclosed applications.

BACKGROUND

Telecommunications networks often use enclosures for containing and protecting telecommunications equipment (e.g., splice locations, optical splitters, multiplexers, connection panels, etc.). Enclosures used in outside environments are provided with latching desirably sealed to prevent moisture intrusion. Gel sealants have worked well for providing perimeter seals between bases and covers of enclosures and for providing seals at any other types of interfaces between the housing pieces of an enclosure. An example gel seal enclosure is disclosed at U.S. Pat. No. 7,603,018. Other sealants, (e.g., elastomeric seals) are also known. However, repeated sealing and unsealing of an enclosure can compromise the integrity of the sealant and thereby the seal itself. Improvements are therefore needed in the way the enclosure engages the sealant during the sealing process, as well as the nature of the interface between the enclosure and the sealant once a seal has been established.

SUMMARY

One aspect of the present disclosure relates to a latching system for an enclosure having first and second housing pieces coupled by a hinge that releasably interface about a perimeter sealant therebetween. The hinge is capable of both rotational movement about an axis of rotation to seal and unseal the enclosure, as well as translational displacement of the axis of rotation for improved alignment between the sealant and the first housing piece prior to forming the seal via the rotational movement.

Another aspect of the present disclosure relates to a latching system between first and second housing pieces that mate about a perimeter sealant at an interface to form an enclosure, the first housing pieces including first and second spaced-apart sealing projections that extend about the perimeter of the enclosure and define a channel therebetween, the projections releasably projecting into the sealant configured to project into the perimeter seal within the first channel when the first and second housing pieces are mated together, and wherein the perimeter seal compresses into the channel when the first and second housing pieces are mated together.

BRIEF DESCRIPTION OF THE DRAWINGS

FIG. 4 is an exploded view of the enclosure of FIG. 1.

FIG. 5A is a cross-sectional view of the enclosure of FIG. 1, the enclosure being in the mated configuration.

FIG. 5B is an expanded view of the callout detail of FIG. 5A.

FIG. 8A is a cross-sectional view of the enclosure of FIG. 1, the enclosure being in the staged configuration.

FIG. 8B is an expanded view of the callout detail of FIG. 8A.

FIG. 10A is a cross-sectional view of the enclosure of FIG. 1, the enclosure being in an open configuration.

FIG. 19 is a perspective view of a cover of the enclosure of FIG. 18.

DETAILED DESCRIPTION

Figure 1:
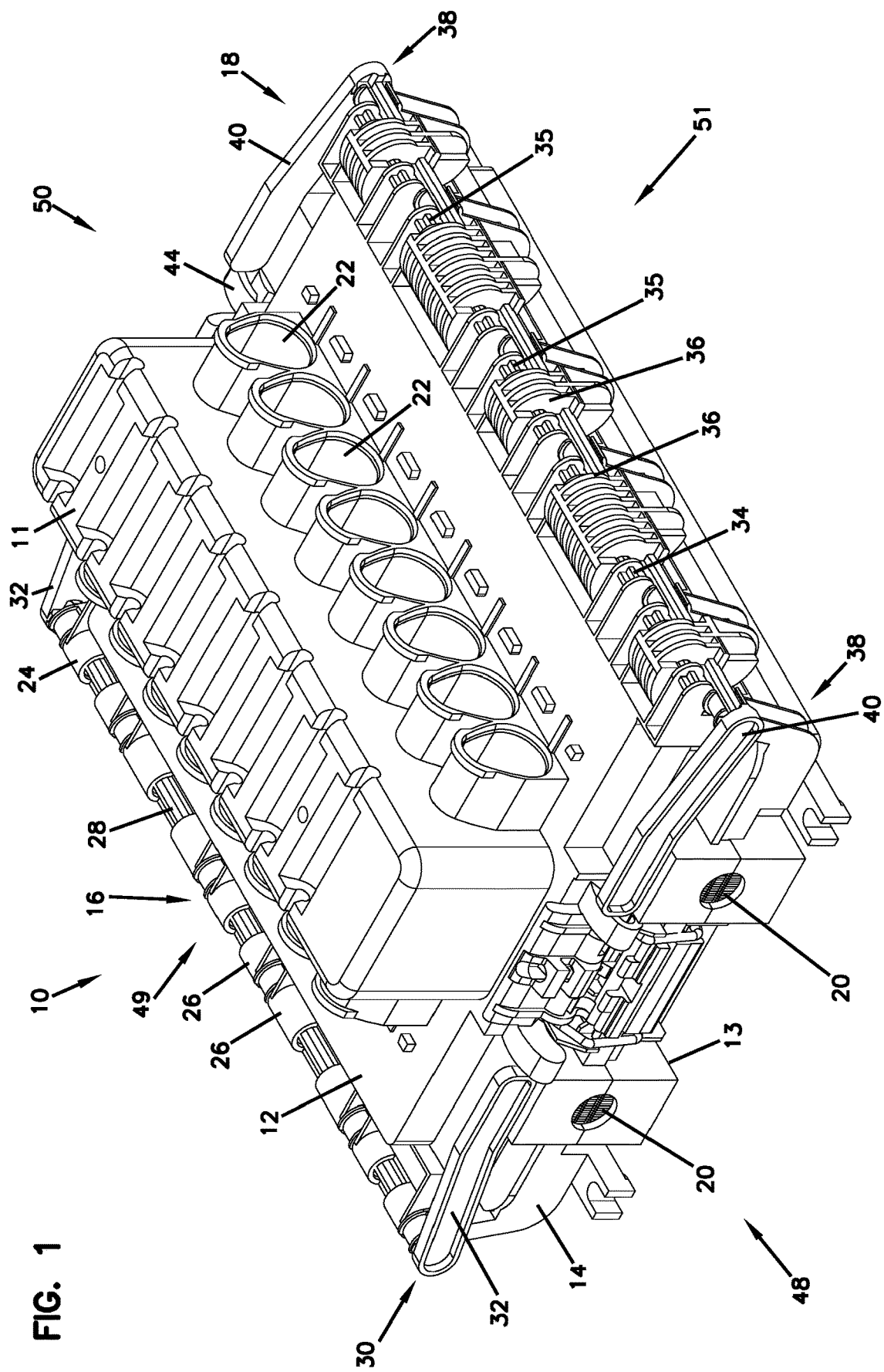
FIG. 1 is a perspective view of an example enclosure in accordance with the present disclosure, showing the enclosure in a mated configuration.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Figure 2:
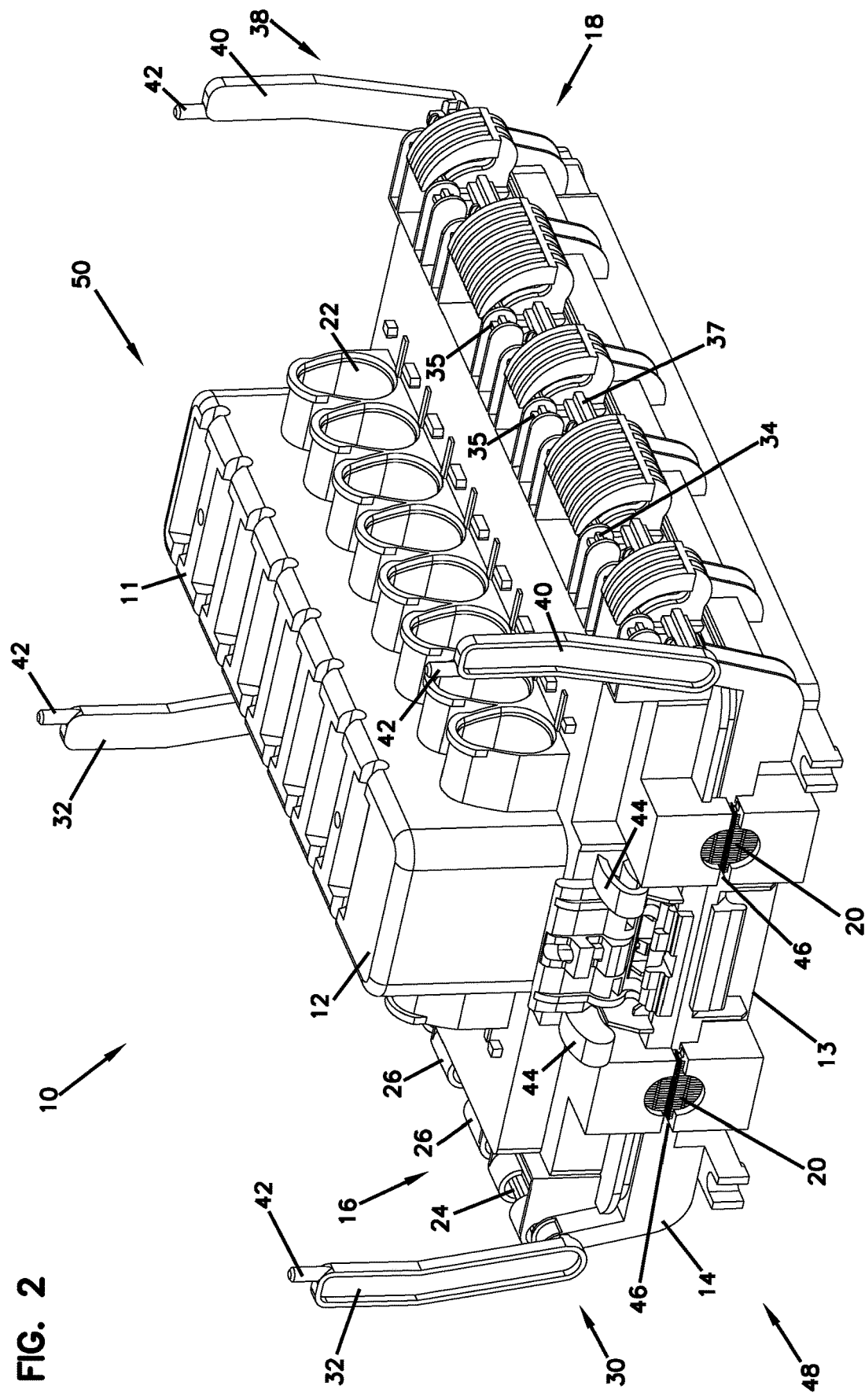
FIG. 2 is a perspective view of the enclosure of FIG. 1 showing the enclosure in a staged configuration.

FIGS. 1-2 illustrate an enclosure 10 in accordance with the principles of the present disclosure. For purposes of orientation with respect to this disclosure, the enclosure 10 is shown from a perspective horizontal orientation, having a top 11 and a bottom 13. It should be appreciated that the enclosure 10 may nevertheless be installed or mounted in any suitable orientation, including but not limited to horizontally and vertically.

The enclosure 10 includes a first housing piece 12 and a second housing piece 14 that fit together to form the enclosure 10. The first housing piece 12 is a base; the second housing piece 14 is a lid. The enclosure 10 includes a latching mechanism consisting of a hinge 16 and a latch 18. The first housing piece 12 is pivotally coupled to the second housing piece 14 via the hinge 16 such that the first housing piece 12 can be pivoted relative to the second housing piece 14 between an open configuration, a staged configuration, and a mated configuration. In FIG. 1, the first housing piece 12 and the second housing piece 14 are shown in a mated configuration. In FIG. 2, the first housing piece 12 and the second housing piece 14 are shown in a staged configuration.

The enclosure 10 optionally includes ports 20, 22 through which conduits (e.g., fiber optic cables) pass. Such conduits may, for example, connect components stored in the interior of the enclosure 10 with the exterior of the enclosure 10.

The hinge 16 includes a barrel 24 disposed on the first housing piece 12, the barrel 24 consisting of a plurality of knuckles 26. The second housing piece 14 includes a hinge cam 28 disposed within the barrel 24. The hinge cam 28 rotates within the barrel 24 and engages an interior surface of the knuckles 26, allowing pivotal and translational movement of the first housing piece 12 relative to the second housing piece 14.

The hinge 16 is operable by a hinge actuator 30. In this example, the hinge actuator 30 includes two hinge levers 32 (e.g., handles) fixedly coupled together via the hinge cam 28. Actuation of the hinge 16 may be achieved by rotating either or both of the hinge levers 32.

The latch 18 includes a latch rod 34 disposed on the first housing piece 12, and a plurality of rod housings 36 disposed on the second housing piece 14. The latch rod 34 is optionally segmented into discrete latch rod segments 35, each of the latch rod segments 35 being integral with the first housing piece 12. The rod housings 36 are linearly connected to one another via a latch cam 37. The latch cam 37 and the rod housings 36 are rotatable in tandem about an actuation axis, the rod housings 36 including grooves (FIG. 5) for releasably engaging the latch rod segments 35 depending on the rotational orientation of the rod housings 36.

The latch 18 is operable by a latch actuator 38. In this example, the latch actuator 38 includes two latch levers 40 fixedly coupled together via the latch cam 37. Actuation of the latch 18 may be achieved by rotating either of the latch levers 40.

Optionally, one or more of the hinge levers 32 and the latch levers 40 includes a first retention member 42 (e.g., a latch or other extension from the free end of the hinge lever 32 and/or the latch lever 40), for removably engaging a corresponding second retention member 44 (e.g., a recess configured to receive the first retention member 42 that extends from the first housing piece 12 and aligns with the first retention member 42 when the first housing piece 12 and the second housing piece 14 are in the mated configuration (FIG. 1)).

With reference to FIG. 2, a gap 46 exists between the first housing piece 12 and the second housing piece 14, as the first housing piece 12 and the second housing piece 14 are not sealed together; however, the first housing piece 12 and the second housing piece 14 are still vertically aligned. The lack of a seal between the first housing piece 12 and the second housing piece 14, and the vertical alignment of the first housing piece 12 and the second housing piece 14 at least partially define the staged configuration of the first housing piece 12 relative to the second housing piece 14.

With reference to FIG. 1, in the example enclosure 10, each of the hinge levers 32 extends substantially toward a corresponding latch lever 40, and vice versa, when the first housing piece 12 and the second housing piece 14 are in the mated configuration. With reference to FIG. 2, each of the hinge levers 32 and the latch levers 40 extends substantially vertically upwards (i.e., towards the top 11 of the enclosure 10) when the first housing piece 12 and the second housing piece 14 are in the staged configuration.

With reference to FIGS. 1-2, the enclosure 10 has a first side 48 and opposing second side 50, as well as hinge side 49 and an opposing latch side 51. In some examples, transforming the enclosure 10 from the mated configuration (FIG. 1) to the staged configuration (FIG. 2), is achieved by releasing each of the first retention members 42 from the corresponding second retention member 44 and raising both the hinge lever 32 and the latch lever 40 (in the directions of the arrows, respectively, in FIG. 5A) on either or both of the first side 48 and the second side 50 into the substantially vertical orientation shown in FIG. 2. Coupling together the pair of hinge levers 32 and coupling together the pair of latch levers 40 together as described above, allows operable access to the hinge actuator 30 and the latch actuator 38 from both the first side 48 and the second side 50.

Figure 3:
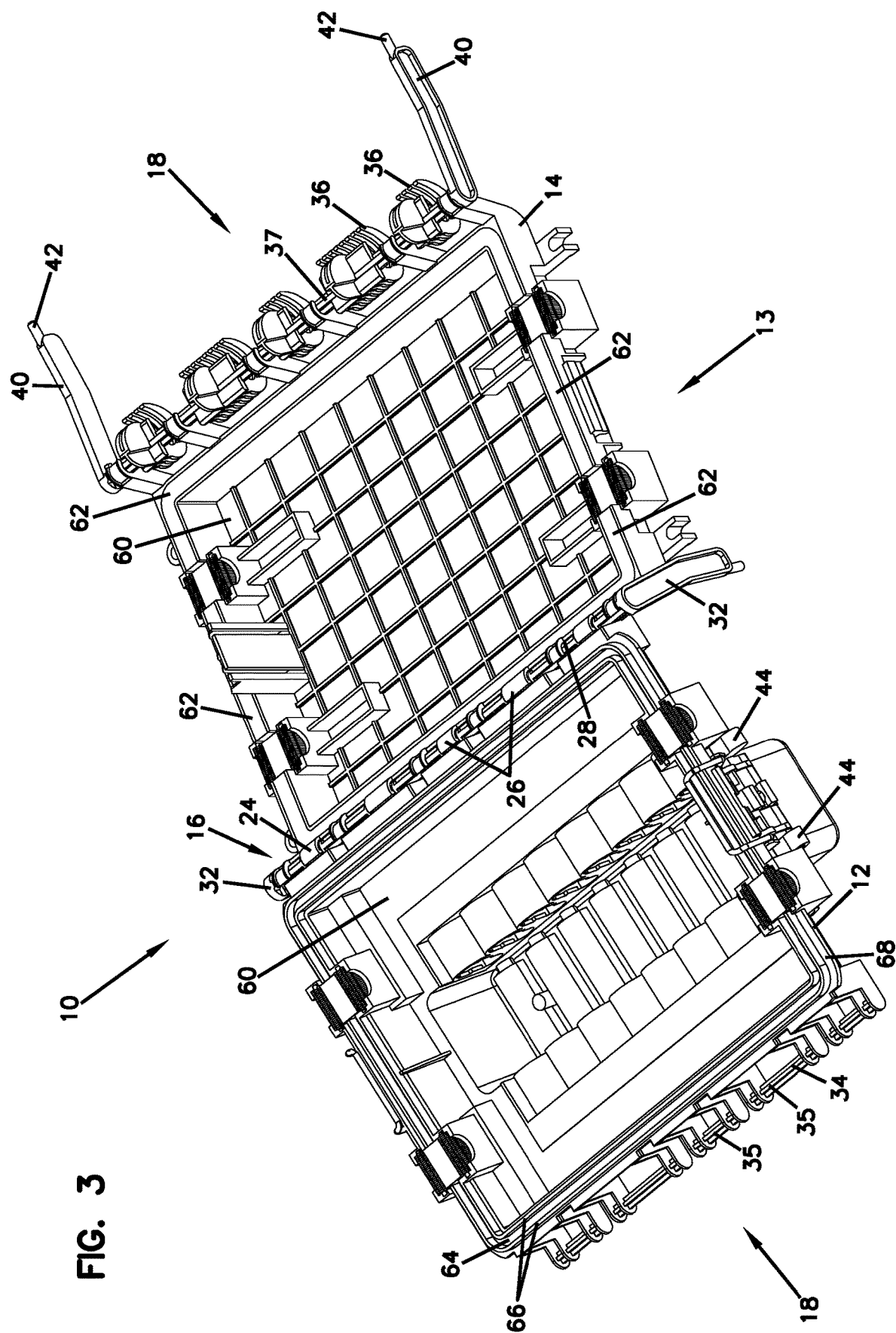
FIG. 3 illustrates the enclosure of FIG. 1 in an open configuration.

FIG. 3 illustrates the enclosure 10 of FIG. 1 in an open configuration, allowing access to any equipment (e.g., telecommunications equipment), that may be housed inside. The enclosure 10 includes the first housing piece 12, the bottom 13, the second housing piece 14, the hinge 16, the latch 18, the barrel 24, the knuckles 26, the hinge cam 28, the hinge levers 32, the latch rod 34, the latch rod segments 35, the rod housings 36, the latch cam 37, the latch levers 40, the first retention members 42, and the second retention members 44, as discussed above. In addition, an example interior space 60 of the enclosure 10 is shown in which equipment (e.g., telecommunications equipment) may be housed.

In the open configuration shown in FIG. 3, the first housing piece 12 has been pivoted together with the hinge levers 32 (e.g., the hinge levers 32 can be used as handles to pivot the first housing piece 12 away from the second housing piece 14; in addition or alternatively, the first housing piece can be simply grasped and pivoted from the staged configuration to the open configuration) such that the first housing piece 12 is upside down and the hinge levers 32 extend substantially vertically downwards (i.e., towards the bottom 13) from the hinge 16. In addition, the latch levers 40 have been rotated such that they extend from the latch 18 substantially horizontally away from the enclosure 10.

A sealant 62 (e.g., a gel) is disposed about the perimeter of the second housing piece 14 within a channel integral with the second housing piece 14. A second channel 64 is integral to the first housing piece 12 and disposed about the perimeter of the first housing piece 12. The second channel 64 is defined between projections 66 (e.g., ribs) that are spaced apart and project vertically from the underside 68 of the first housing piece 12, the underside 68 being a closed end of the second channel 64.

FIG. 4 is an exploded view of the enclosure 10 of FIG. 1, having the first housing piece 12, the second housing piece 14, the ports 20, the barrel 24, the knuckles 26, the hinge cam 28, the hinge levers 32, the latch rod 34, the latch rod segments 35, the rod housings 36, the latch cam 37, the latch levers 40, the interior space 60, and the sealant 62 as discussed above. In the addition, the first channel 70 is shown having an open side 71 that faces toward the first housing piece 12 when the first and second housing pieces (12, 14) are mated. The sealant 62 has multiple sections 72, which are housed in corresponding sections of the first channel 70. As shown the sealant 62 is discontinuous across the ports 20 to allow cables to pass through the ports 20 from the exterior of the enclosure 10 into the interior space 60 between sections 72 of the sealant 62. Also shown in FIG. 4 are hinge cam supports 74. The hinge cam supports 74 are spaced apart along a length of the second housing piece 14 and extending therefrom. Each of the hinge cam supports 74 includes a bore that houses a portion of the hinge cam 28. The interface between the bores of the hinge cam supports 74 and the hinge cam 28 is such that the hinge cam 28 can rotate within the bores.

Figure 6:
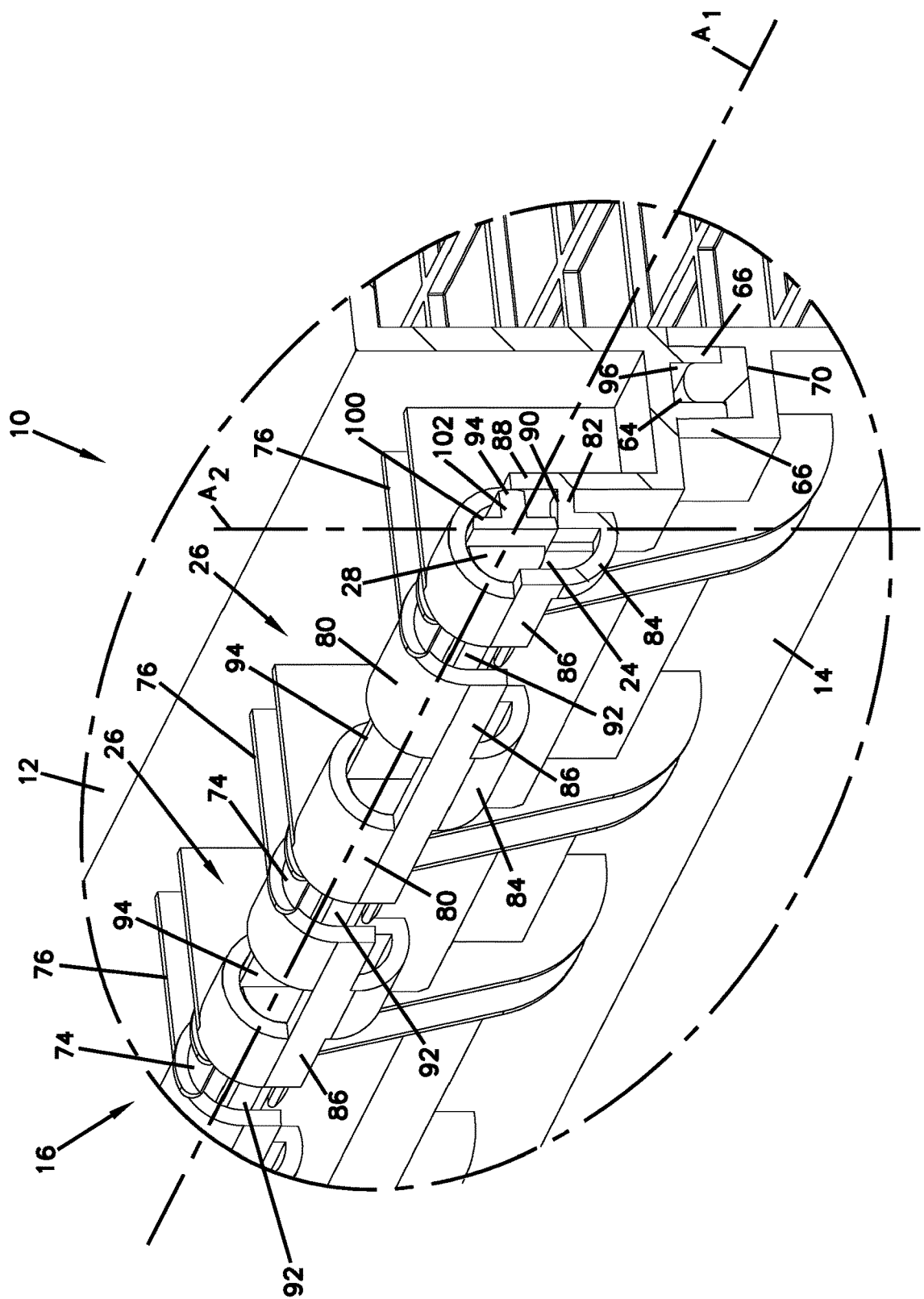
FIG. 6 is a detailed view of a portion of the hinge of FIG. 1 on the enclosure of FIG. 1, the enclosure being in a mated configuration and the figure illustrating a cross-sectional view of a rotationally symmetric segment of the hinge cam of FIG. 1.
Figure 7:
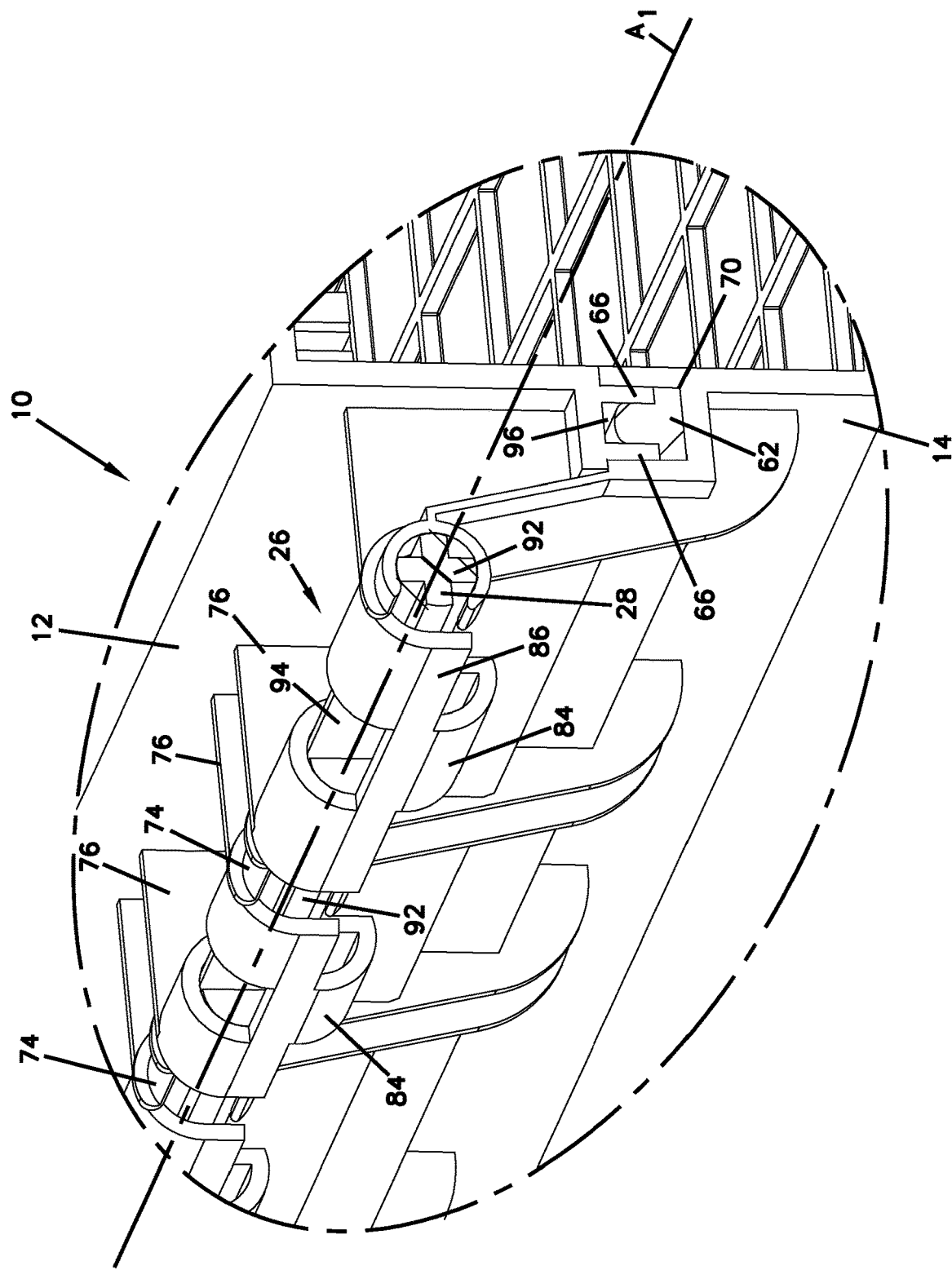
FIG. 7 is a detailed view of a portion of the hinge of FIG. 1 on the enclosure of FIG. 1, the enclosure being in a mated configuration and the figure illustrating a cross-sectional view of a rotationally asymmetric segment of the hinge cam of FIG. 1.

FIG. 5A is a cross-sectional view of the enclosure 10 of FIG. 1, the enclosure 10 being in the mated configuration. FIG. 5B is an expanded view of the callout detail of FIG. 5A. FIG. 6 is a detailed view of a portion of the hinge 16 of FIG. 1 on the enclosure 10 of FIG. 1, the enclosure 10 being in a mated configuration and the figure illustrating a cross-sectional view of a rotationally symmetric segment 92 of the hinge cam 28 of FIG. 1. FIG. 7 is a detailed view of a portion of the hinge 16 of FIG. 1 on the enclosure 10 of FIG. 1, the enclosure 10 being in a mated configuration and the figure illustrating a cross-sectional view of a rotationally asymmetric segment 94 of the hinge cam 28 of FIG. 1.

With reference to FIG. 5B, the axis of rotation of the hinge cam 28 travels into and out of the page through the point marked $A_1$. In transitioning to the staged configuration, the first housing piece 12 moves upward relative to the axis of rotation $A_1$. This is depicted in FIG. 8, in which the distance between $A_1$ and the top of the knuckle 26 is greater than the distance between $A_1$ and the top of the knuckle 26 in the mated configuration (FIG. 5B). That is the, axis of rotation $A_1$ translates relative to the first housing piece 12 as the enclosure 10 moves between the mated configuration and the staged configuration. Relative to the second housing piece 14, the axis of rotation $A_1$ is stationary as the enclosure 10 is transitioned between the mated configuration and the staged configuration and vice versa. This is depicted in FIG. 7, in which the axis of rotation $A_1$ is shown traveling through a portion of the hinge cam 28 disposed in a hinge cam support 74, the hinge cam support 74 being integral with the second housing piece 14. As illustrated in FIG. 7, the hinge cam support 74 houses the hinge cam 28 such that any shifting of the axis of rotation $A_1$ relative to the hinge cam support 74 (and thereby relative to the second housing piece 14) when the hinge cam 28 is rotated (e.g., to move the enclosure 10 from the mated position to the staged configuration or vice versa), is prevented.

In addition, with reference to FIGS. 6-7, the enclosure 10 includes buttresses 76 extending from a side of the first housing piece 12. The buttresses 76 support the knuckles 26 and couple the knuckles 26 to the first housing piece 12.

With reference to FIG. 6, between adjacent pairs of the hinge cam supports 74 is disposed one of the knuckles 26. Each knuckle 26 includes two semi-circular (or approximately semi-circular) upper sleeve segments 80 open at their bottom, a ledge 82, and a quadrant shaped (or approximately quadrant shaped) lower sleeve segment 84 open at its top and disposed between the two upper sleeve segments 80. Thus, each knuckle 26 is uncovered above the lower sleeve segment 84 and bottomless below the upper sleeve segments 80. The barrel 24 discussed above runs longitudinally (i.e., along the axis $A_1$ in FIG. 6) through the knuckles 26 and the bores of the hinge cam supports 74, and is configured to rotatably house the hinge cam 28. A first spacing element 86 (e.g., a longitudinally oriented bar) vertically distances the upper sleeve segments 80 from the lower sleeve segment 84. A second spacing element 88 (e.g., a longitudinally oriented bar) vertically distances the upper sleeve segments 80 from the ledge 82. The upper sleeve segments 80 are attached to an upper side of the first spacing element 86 and an upper side of the second spacing element 88. The ledge 82 extends inward (i.e. toward the vertical axis $A_2$ in FIG. 6 that bisects upper sleeve segments 80) from the bottom of the second spacing element 88. The lower sleeve segment 84 is attached to an underside of the spacing element 86 and to the ledge 82.

With reference to FIG. 5B, a reaction surface 90 (e.g., a cam supporting surface) of the ledge 82 is inclined upward (as it projects radially inward) relative to the horizontal line $A_3$ shown in FIG. 5B. Alternatively, only a portion of the cam supporting surface 90 is so angled.

With reference to FIGS. 6 and 7, the hinge cam 28 is continuous between its two longitudinal ends and includes alternating rotationally symmetric segments 92 and rotationally asymmetric segments 94. The rotationally symmetric segments 92 are disposed at least within the bores of the hinge cam supports 74. In some examples the rotationally symmetric segments 92 have an X or "plus sign" transverse cross-section. The surfaces of the rotationally symmetric segments 92 that engage the bores of the hinge cam supports 74 may be curved or rounded to facilitate rotation of the hinge cam 28 within the hinge cam supports 74. In some examples, spacer discs are disposed between adjacent rotationally symmetric segments 92 and rotationally asymmetric segments 94.

The rotationally asymmetric segments 94 are disposed at least within longitudinal sections of the barrel 24 bounded by the lower sleeve segments 84. In a particular example, the rotationally asymmetric segments 94 are disposed within the entire longitudinal length of each of the knuckles 26 and the rotationally symmetric segments 92 are disposed within the bores of the hinge cam supports 74.

With reference to FIGS. 6-7, the hinge cam 28 is translationally fixed relative to the second housing piece 14. When the enclosure 10 is in the mated configuration shown (corresponding to the farthest clockwise rotation of the hinge cam 28 about the axis $A_1$ in FIG. 5), each rotationally asymmetric segment 94 engages both the cam supporting surface 90 and an inner surface of an upper sleeve segment 80. This cooperation between the hinge cam 28 and the knuckles 26 on the first housing piece 12 forces the knuckles 26 downward into an alignment between the upper sleeve segments 80 and the hinge cam 28 by applying a downward pressure on the ledge 82 and thereby on the first housing piece 12, forcing the first housing piece 12 downward toward the fixed second housing piece 14.

This downward force causes the projections 66 to forcibly engage the sealant 62 disposed in the first channel 70. The force applied by the projections 66 on the sealant 62 in turn causes the sealant to compress both under and between the projections 66, thereby forming a seal between the first housing piece 12 and the second housing piece 14. In some examples, an air gap 96 remains within the second channel 64 between the projections 66 and above the sealant 62. Upon compression, the sealant 62 exerts a biasing force vertically upward on the projections 66, as the sealant 62 is disposed to revert to its relaxed (i.e., uncompressed) state. The biasing force tends to vertically separate the first housing piece 12 from the second housing piece 14, with the engagement of the first and second retention members (42, 44) maintaining the mated configuration for the enclosure 10 against the biasing force exerted by the sealant 62. In addition, because the air in the air gap 96 is compressible (and more compressible than the sealant 62), a component of the sealant's 62 biasing force is expended compressing the air in the air gap 96, resulting in a lower magnitude vertically upward biasing force exerted on the first housing piece 12 than if no air gap were present. A smaller upwards force on the first housing piece 12 improves the effectiveness of the seal by inhibiting separation of the first housing piece 12 from the second housing piece 14.

In some examples, for an enhanced seal between the first housing piece 12 and the second housing piece 14, the projections 66 mate with the second channel 64 in a nesting manner. This is accomplished, for example, with a gradual downward narrowing of the second channel 64 and a corresponding tapering of the projections 66. A nesting cooperation between the projections 66 and the second channel 64 can also facilitate the initial placement of the projections 66 within the second channel 64 when rotating the first housing piece 12 from the open configuration to the staged configuration with the second housing piece 14, as the tapered ends of the projections 66 first engage the wider portion (i.e. the open side 71 (FIG. 4)) of the first channel 70.

Figure 9:
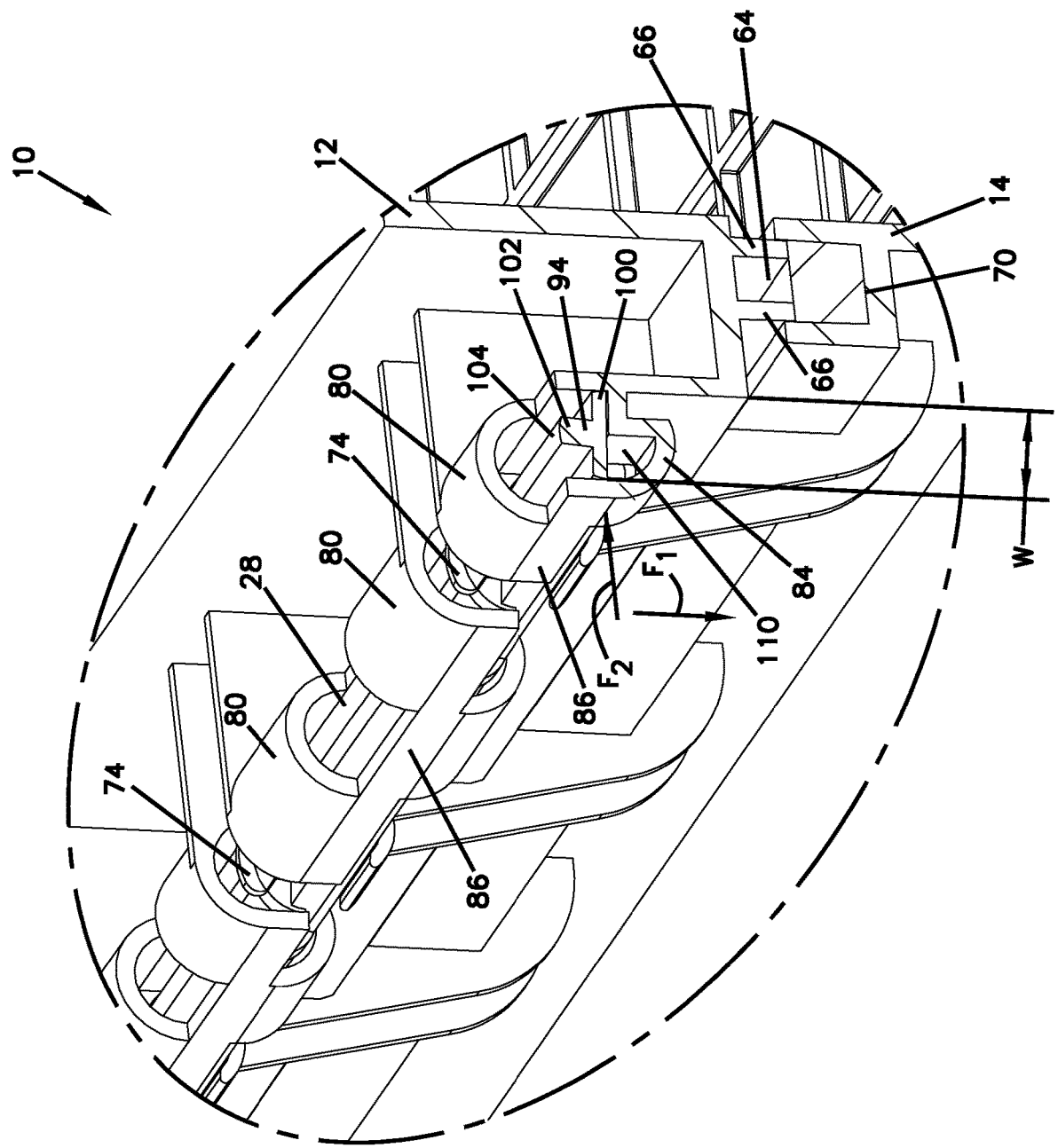
FIG. 9 is a detailed view of a portion of the hinge of FIG. 1 on the enclosure of FIG. 1, the enclosure being in a staged configuration and the figure illustrating a cross-sectional view of a rotationally asymmetric segment of the hinge cam of FIG. 1.

FIG. 8A is a cross-sectional view of the enclosure 10 of FIG. 1, the enclosure 10 being in the staged configuration. FIG. 8B is an expanded view of the callout detail of FIG. 8A. FIG. 9 is a detailed view of a portion of the hinge 16 of FIG. 1 on the enclosure 10 of FIG. 1, the enclosure 10 being in a staged configuration and the figure illustrating a cross-sectional view of a rotationally asymmetric segment 94 of the hinge cam 28 of FIG. 1.

With reference to FIGS. 8-9, in the staged configuration the first housing piece 12 and the second housing piece 14 are in registration with each other, with the projections 66 being in registration with the sealant 62 but without forming a seal between the first housing piece 12 and the second housing piece 14. The staged configuration is achieved by rotating the hinge levers 32 and the latch levers 40 away from either the mated configuration towards the open configuration or away from the open configuration towards the mated configuration. That is, the staged configuration is a transitional configuration between the open configuration and the mated configuration.

From the mated configuration, to reach the staged configuration the first housing piece 12 translates relative to the second housing piece 14 without rotating (i.e., without pivoting) relative to the second housing piece 14. Likewise, from the staged configuration, the first housing piece 12 translates relative to the second housing piece 14 without rotating relative to the second housing piece 14. Both of these movements from staged configuration to mated configuration and from mated configuration to staged configuration are actuated by rotating the hinge levers 32 in the same rotational direction as required to shift between the open configuration and the staged configuration and the staged configuration to the open configuration, respectively.

Registering the first housing piece 12 and the second housing piece 14 in a transitional step before opening the enclosure 10 or mating the enclosure 10, reduces wear and tear on the seal, e.g., by reducing rotational friction on the sealant 62 and the projections 66. This also improves the re-enterability of the enclosure 10 (i.e., its ability to be opened and closed numerous times without losing the ability to provide effective sealing). Creating a seal with translational rather than exclusively rotational movement can also improve the quality and effectiveness of the seal, allowing for a tighter fit between the projections 66 and the first channel 70 about the sealant 62 when the enclosure 10 is in the mated configuration.

With reference to FIG. 9, the rotationally asymmetric segments 94 include a base portion 100 and a flange 102, the flange 102 extending perpendicularly from the base portion 100, creating a T-shaped transverse cross-section of the rotationally asymmetric segments 94. In the staged configuration, at least a portion of the base portion 100 lies on the ledge 82. The hinge cam 28 is translationally fixed relative to the second housing piece 14. Rotating the hinge cam 28 clockwise in FIG. 9 results in a downward force $F_1$ applied by the base portion 100 on the ledge 82. This downward force pushes the first housing piece 12 downward (the ledge 82 is integral with the first housing piece 12) into the sealant 62. The downward movement of the first housing piece 12 occurs as the base portion 100 rotates up the inclined surface of the ledge 82. With the upper sleeve segments 80 of the first housing piece 12 pressed downward by the force applied by the base portion 100 on the ledge 82, with further clockwise rotation of the hinge cam 28 the base portion 100 becomes vertically wedged between the upper portion of the inclined ledge 82 and the upper sleeve segments 80 (see FIG. 6), thereby establishing the mated configuration of the enclosure 10. The sides of the base portion 100 that engage the ledge 82 and the upper sleeve segments 80 may be rounded, curved or tapered to facilitate rotation until wedging has been achieved. The incline of the ledge 82 can also prevent undesirable wedging of the rotationally asymmetric segment 94 prior to reaching the configuration shown in FIG. 6. In some examples, the width w of the base portion 100 is equivalent (or approximately equivalent) to the distance between the upper end of the inclined ledge 82 and the top of the inner surface of corresponding upper sleeve segment 80.

When the hinge cam 28 is rotated to the configuration shown in FIG. 6, the flange 102 horizontally (or substantially horizontally) engages an inner surface of the upper sleeve segments 80 and/or the second spacing element 88, thereby horizontally wedging the hinge cam 28 between the upper portion of the inclined ledge 82 and the upper sleeve segment 80, thereby establishing the mated configuration of the enclosure 10. In the staged configuration (FIG. 9), because the first housing piece 12 is raised relative to the second housing piece 14, the flange 102, which faces upward in the staged configuration, does not engage the first housing piece 12. In some examples, the flange 102 has a rounded or curved upper surface 104 (FIG. 9) to facilitate rotation until wedging has been achieved. By both vertically and horizontally wedging the rotationally asymmetric segments within the knuckles 26 is provided a robust mating between the first housing piece 12 and the second housing piece 14 about the sealant 62.

To release the enclosure 10 from the mated configuration, the hinge cam 28 is rotated counterclockwise (FIG. 6), which causes the base portion 100 to effectively slide down the inclined ledge 82 as the first housing piece 12 rises relative to the second housing piece 14 on account of the upward reciprocating force generated by the compressed sealant 62.

Figure 10B:
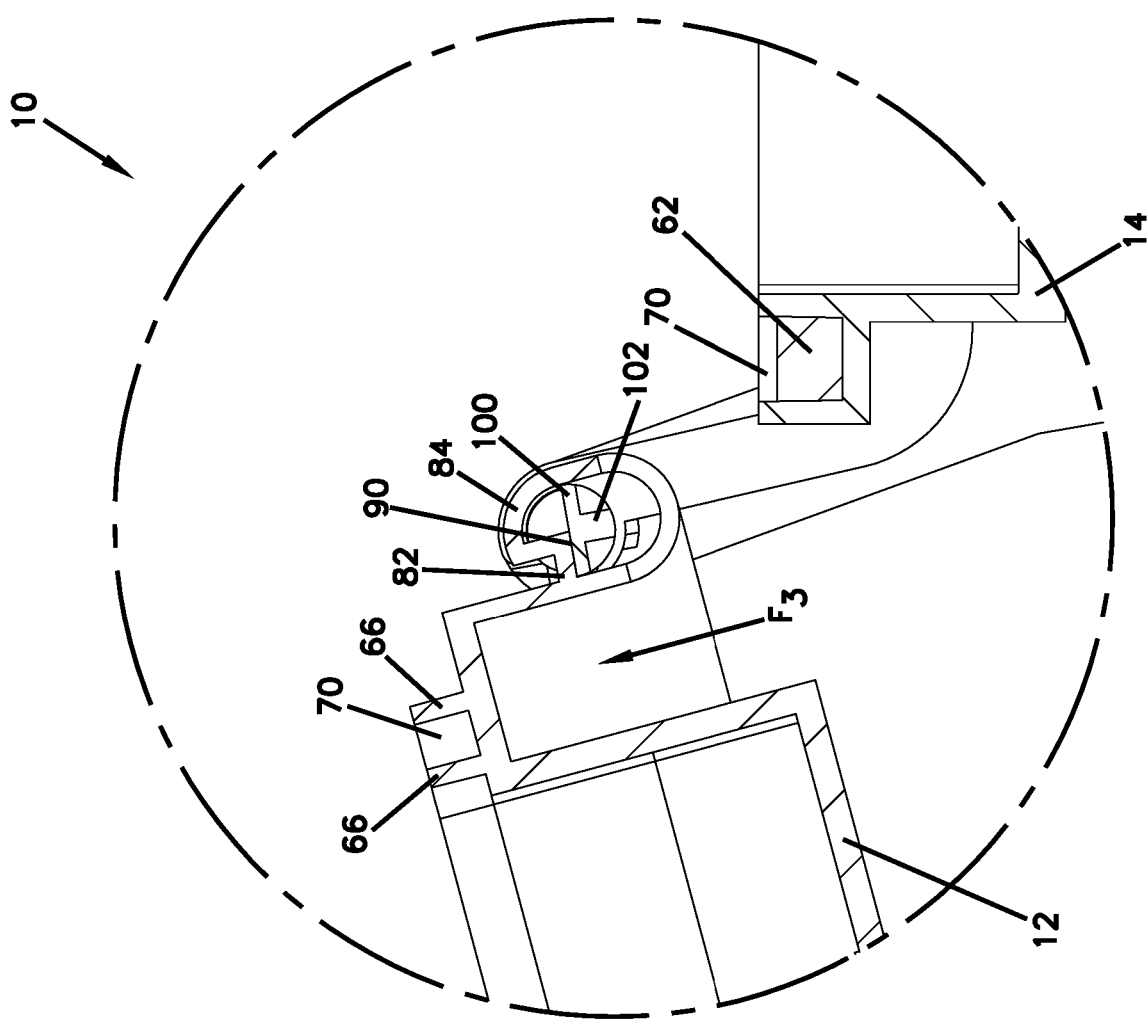
FIG. 10B is an expanded view of the callout detail of FIG. 10A.

FIG. 10A is a cross-sectional view of the enclosure 10 of FIG. 1, the enclosure 10 being in an open configuration. FIG. 10B is an expanded view of the callout detail of FIG. 10A. With reference to FIG. 9, further counterclockwise rotation of the hinge cam 28 eventually causes the underside of the base portion 100 to apply a horizontal force $F_2$ to an inner surface 110 of the lower sleeve segment 84. This horizontal force causes the entire first housing piece 12 to pivot counterclockwise relative to the second housing piece 14, thereby opening the enclosure 10 into an open configuration, such as the open configuration shown in FIG. 10. It should be appreciated that any configuration in which the first housing piece 12 is rotated away from registration with the second housing piece 14 constitutes an open configuration for the enclosure 10.

Prior to rotating the hinge cam 28 clockwise again to bring the enclosure 10 into a staged configuration, the base portion 100 rests on the inner surface 110 of the lower sleeve segment 84 (not shown). In FIG. 10, the hinge cam 28 has already been sufficiently rotated clockwise from a configuration in which the hinge base portion 100 rests on the inner surface 110 such that the base portion 100 again rests on the ledge 82, although while the enclosure 10 is an open configuration. Thus, it should be appreciated that any further clockwise rotation of the hinge cam 28 beyond the position shown in FIG. 10B will apply a force $F_3$ on the ledge 82, causing the entire first housing piece 12 to pivot clockwise back towards the staged configuration of FIG. 9. Alternatively, it should be appreciated that the enclosure 10 can be adjusted back and forth between the open configuration and the closed configuration simply taking hold of the first housing piece 12 and pivoting it relative to the second housing piece 14. For example the configuration shown in FIG. 10 can be achieved simply by pivoting the entire first housing piece 12 as shown in FIG. 9 away (in a counterclockwise direction) from the first housing piece 14.

Figure 11:
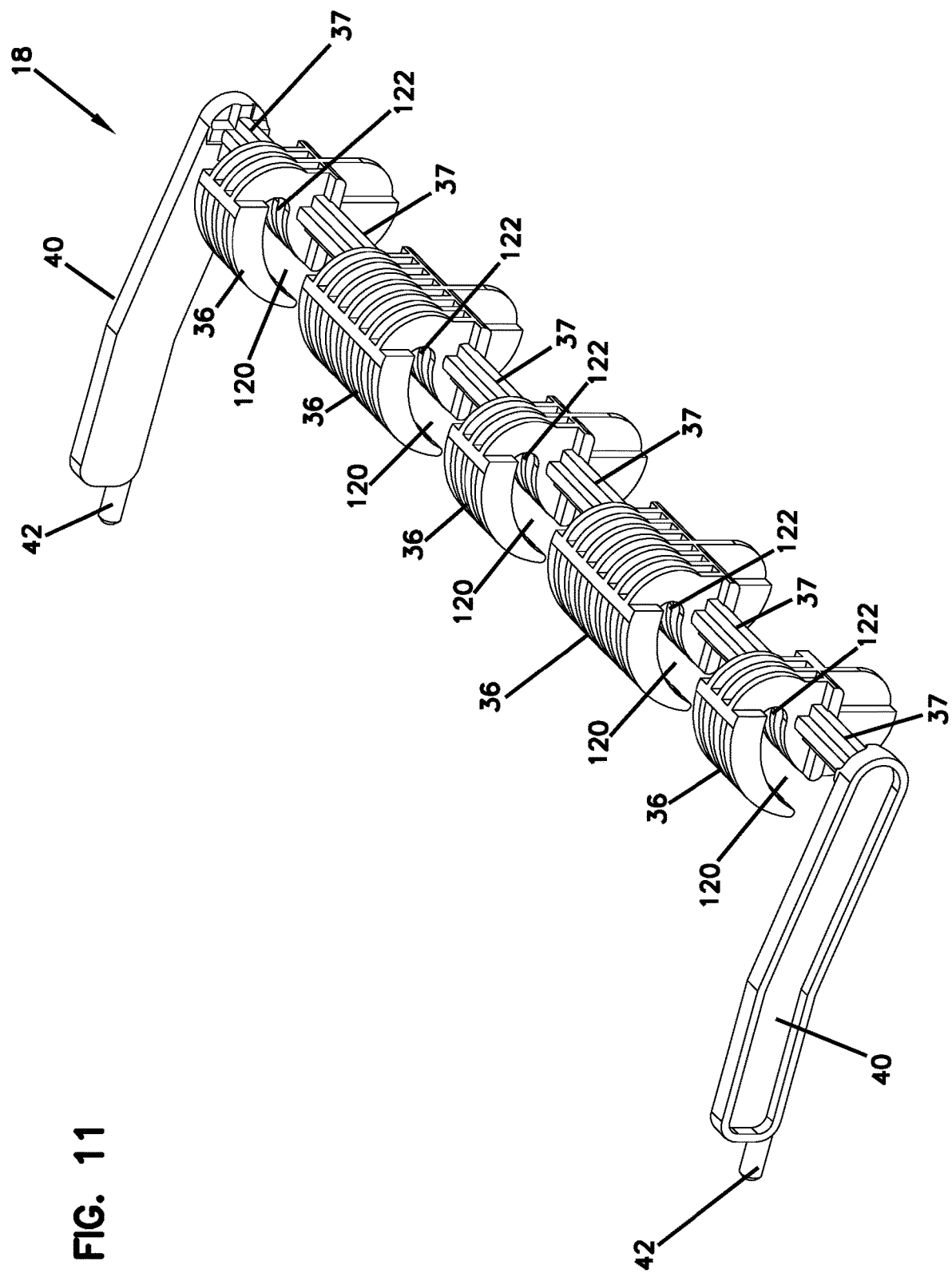
FIG. 11 is a perspective view of the latch of FIG. 1.

FIG. 11 is a perspective view of the latch 18 of FIG. 1. The latch 18 includes the latch rod housings 36, the latch cam 37, the latch levers 40, and the first retention mechanisms 42 as discussed above. In this example latch 18, each of the latch rod housings 36 includes a slot 120. The slot 120 is arcuate in shape allowing pivoting of the latch rod housing 36 about a latch rod 34 (FIG. 1). When the enclosure 10 is fully latched, the latch rod 34 is housed in the deepest portion 122 of the slots 120. With sufficient rotation of the latch cam 37 away from the latched position, the latch rod 34 (FIG. 1) completely disengages the slots 120, allowing the first housing piece 12 to pivot out to a configuration such as that shown in FIG. 3. It should be appreciated that alternative latching mechanisms to the example shown in the figures may be used with the enclosure 10.

Figure 12:
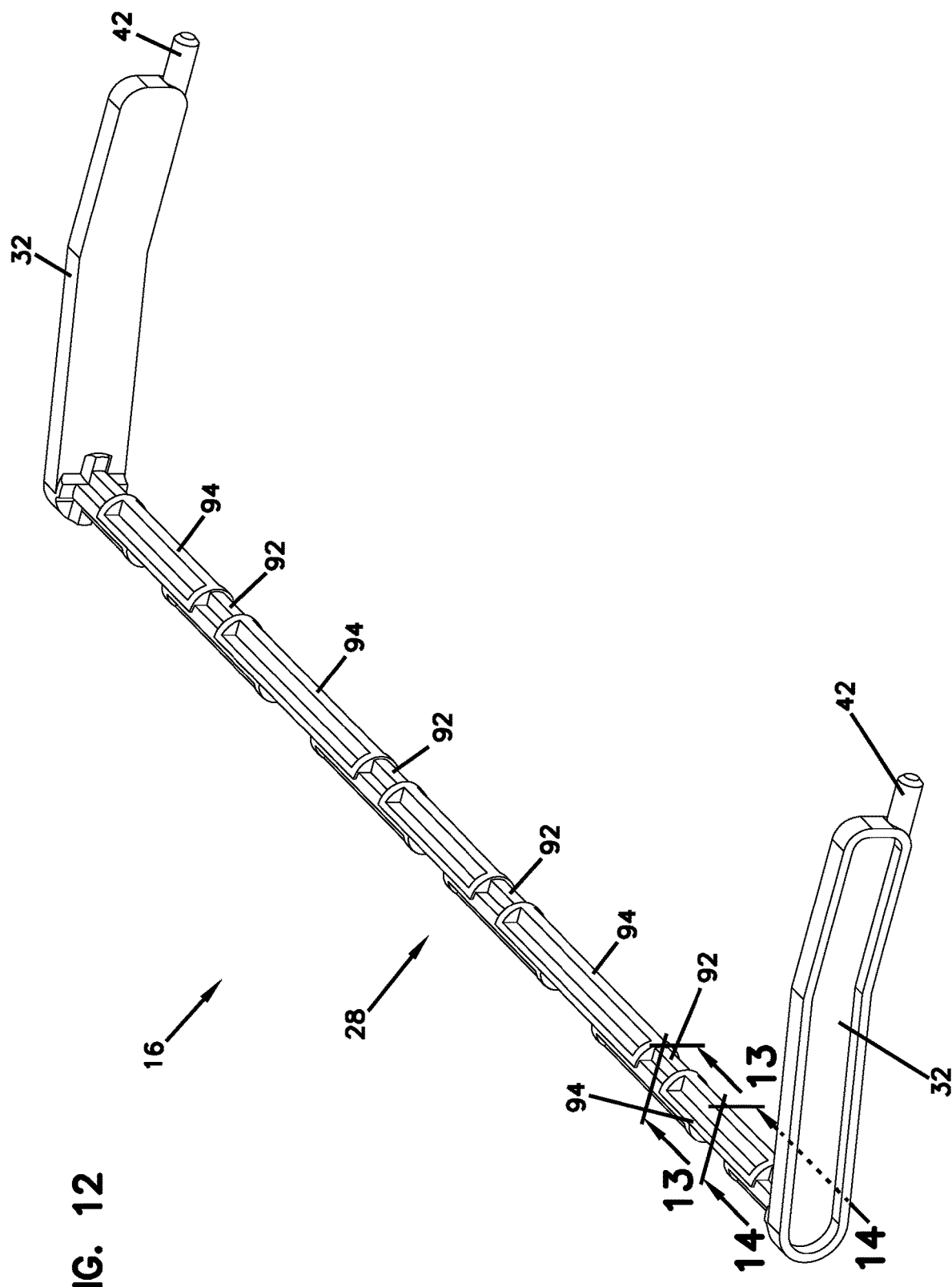
FIG. 12 is a perspective view of a portion of the hinge of FIG. 1.
Figure 13:
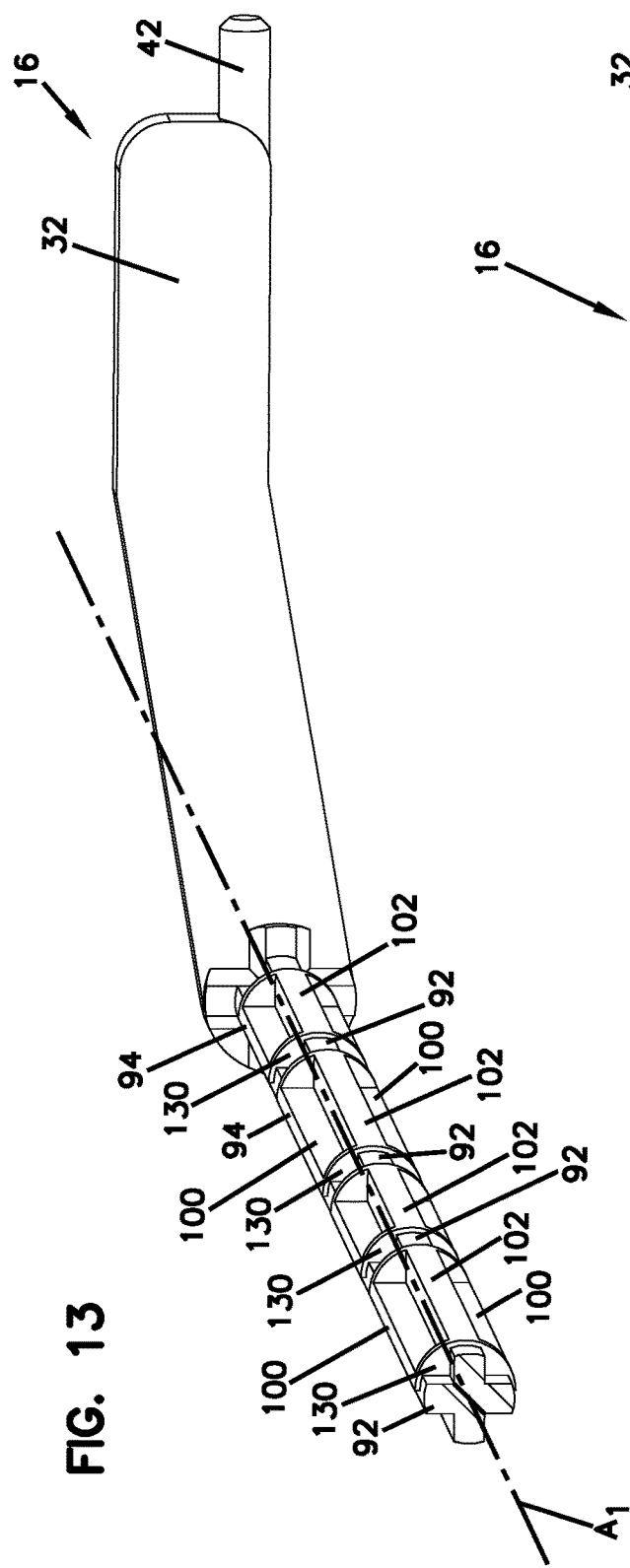
FIG. 13 is a cross-sectional view of the hinge portion of FIG. 12 along the line 13-13 in FIG. 12.
Figure 14:
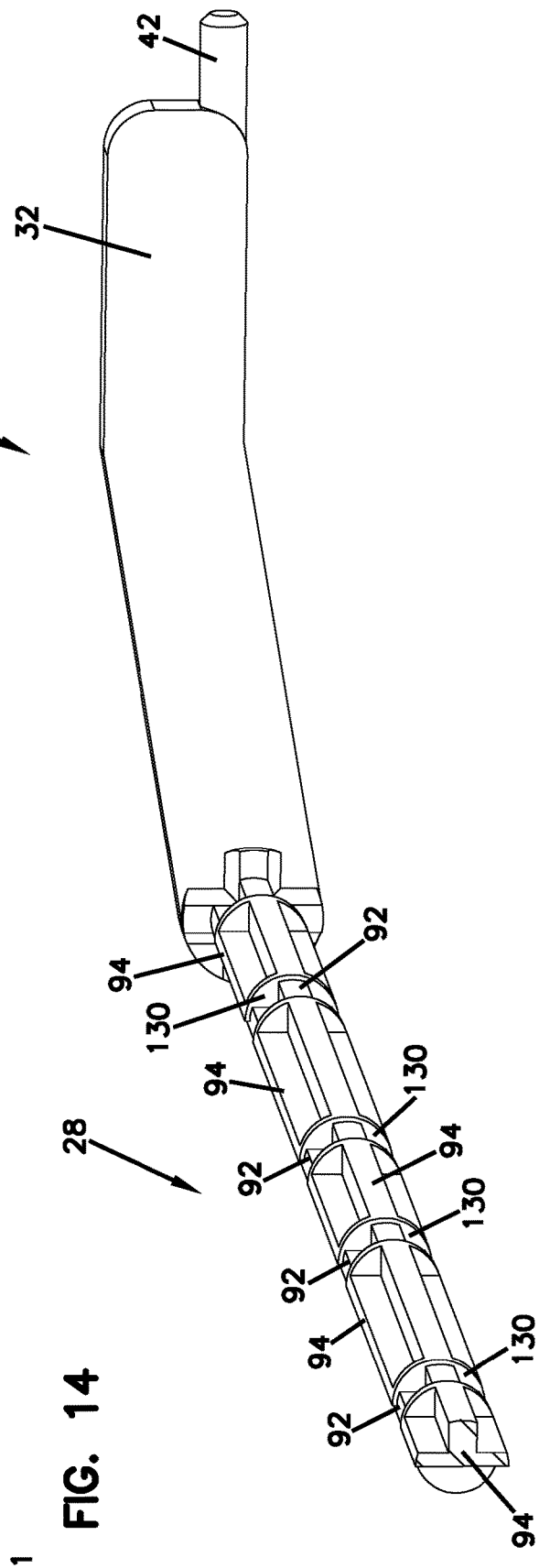
FIG. 14 is a cross-sectional view of the hinge portion of FIG. 12 along the line 14-14 in FIG. 12.

FIG. 12 is a perspective view of the a portion of the hinge 16 of FIG. 1, including the hinge cam 28, the hinge levers 32, the first retention members 42, the rotationally symmetric segments 92 and the rotationally asymmetric segments 94, as discussed above. FIG. 13 is a cross-sectional view of the hinge portion of FIG. 12 along the line 13-13 in FIG. 12, showing a transverse cross-section of rotationally symmetric segment 92, as discussed above. FIG. 14 is a cross-sectional view of the hinge portion of FIG. 12 along the line 14-14 in FIG. 12, showing a transverse cross-section of rotationally asymmetric segment 94, as discussed above. As shown in FIGS. 13-14, the terminal ends of the hinge cam 28 are coupled to the hinge levers 32 (e.g., via a frictional fit between a protruding rotationally symmetric segment 92 and a correspondingly shaped recess in the hinge lever 32). It should be appreciated that the rotationally symmetric segments 92 need not have the transverse cross-sectional shape shown in the figures. As an example alternative, the rotationally symmetric segments are cylindrical with round transverse cross-sections. As shown in FIGS. 13-14, optional spacer discs 130 separate rotationally symmetric segments 92 from adjacent rotationally asymmetric segments 94. As further shown in FIGS. 13-14, in this example embodiment, the flange 102 and the base portion 100 of the rotationally asymmetric segments 94 extend radially outward from the axis of rotation $A_1$ to a greater extent than the rotationally symmetric segments 92.

Figure 15:
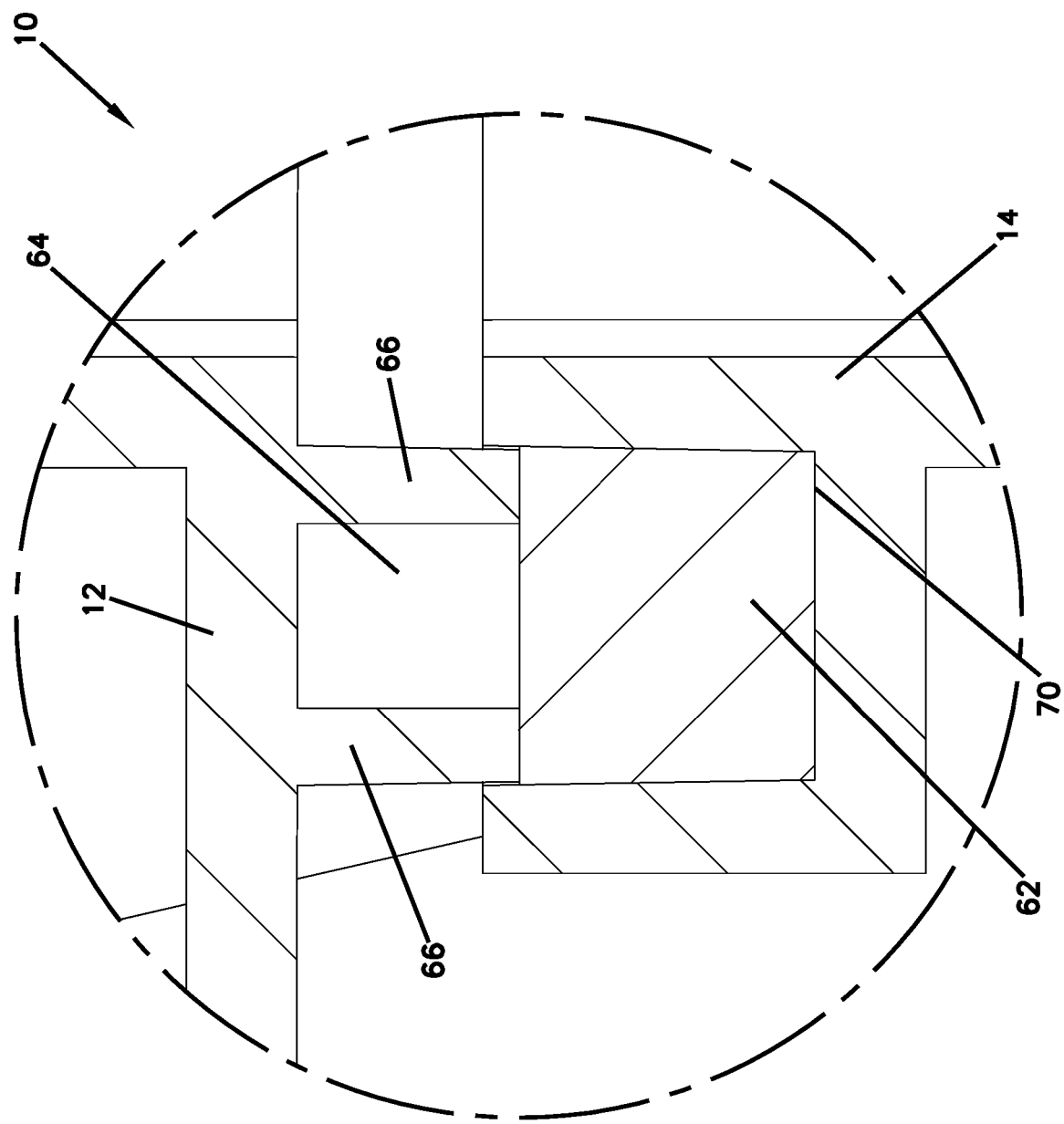
FIG. 15 is an expanded view of the callout detail of FIG. 8B, showing cross-sectional view of a portion of the enclosure of FIG. 1 in the staged configuration.
Figure 16:
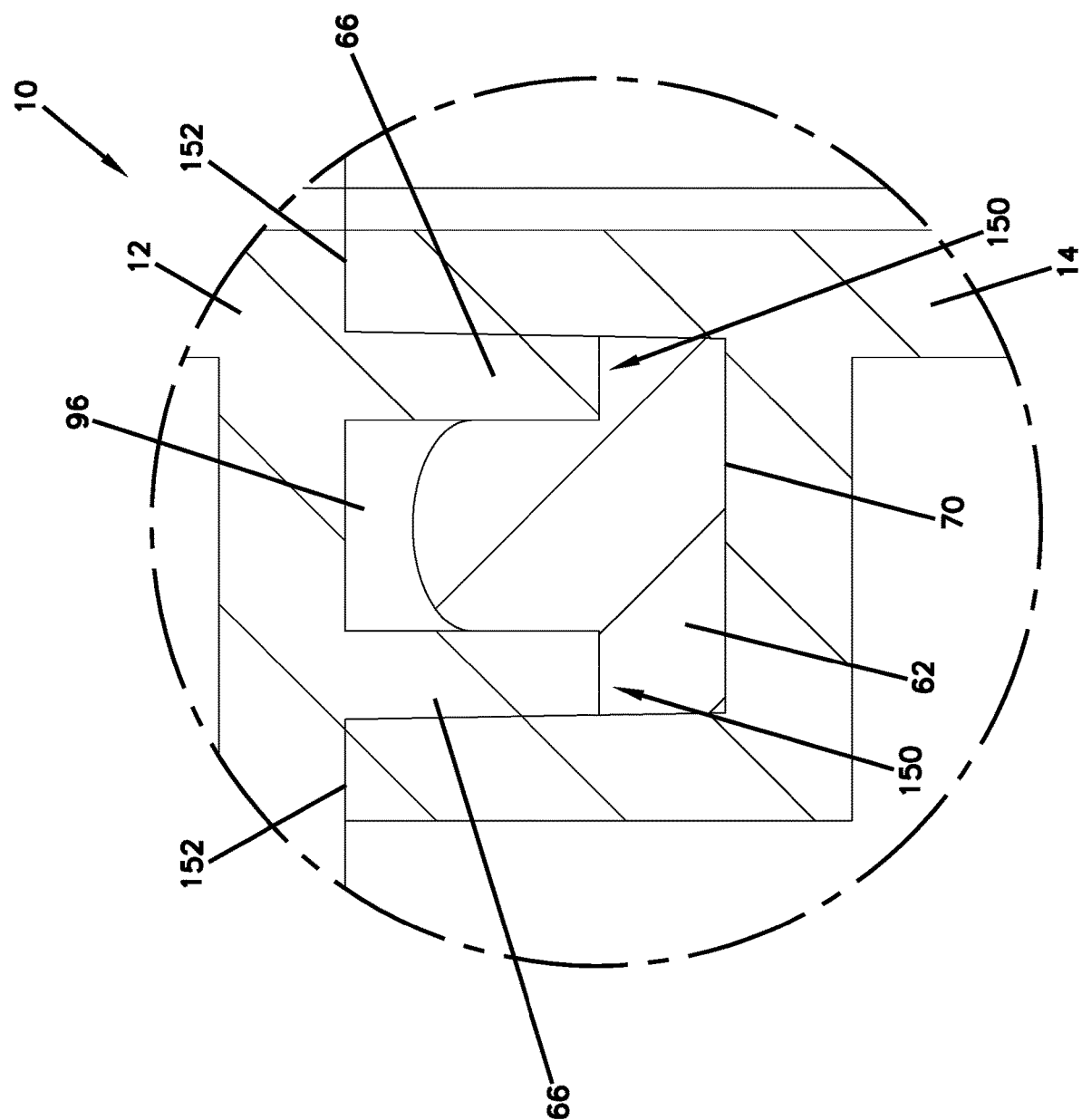
FIG. 16 is an expanded view of the callout detail of FIG. 5B, showing a cross-sectional view of a portion of the enclosure of FIG. 1 in the mated configuration.
Figure 17:
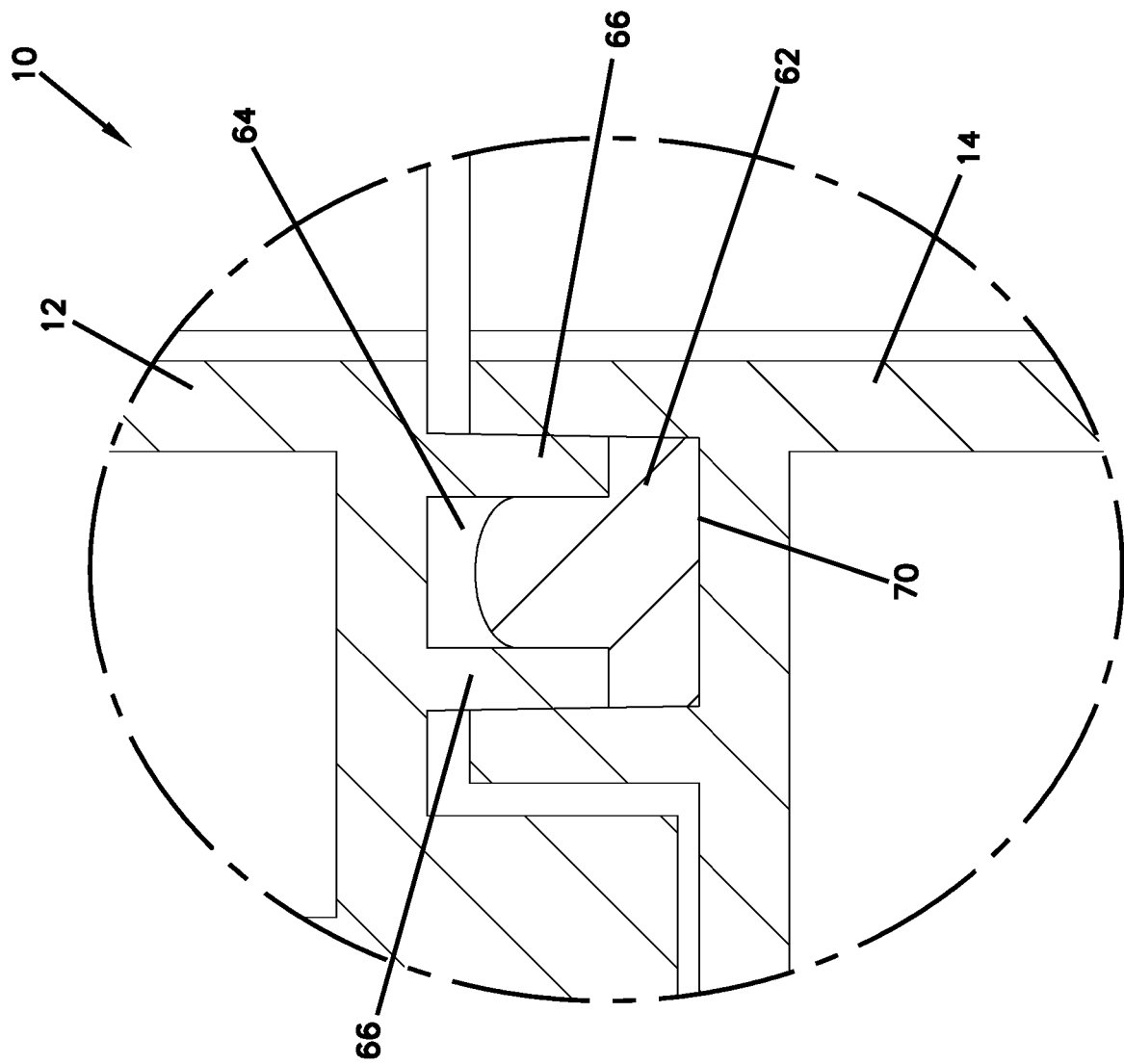
FIG. 17 is a cross-sectional view of the area of the enclosure of FIGS. 15-16 showing the enclosure in an intermediate configuration between the staged configuration and the mated configuration.

FIG. 15 is an expanded view of the callout detail of FIG. 8B, showing a cross-sectional view of a portion of the enclosure 10 of FIG. 1 in the staged configuration. FIG. 16 is an expanded view of the callout detail of FIG. 5B, showing a cross-sectional view of a portion of the enclosure 10 of FIG. 1 in the mated configuration defined by a seal 150 formed between the first housing piece 12 and the second housing piece 14 and an interface 152. FIG. 17 is a cross-sectional view of the area of the enclosure 10 of FIGS. 15-16 showing the enclosure 10 in an intermediate configuration between the staged configuration and the mated configuration. The intermediate configuration of FIG. 17 occurs, e.g., during translational upward or downward movement of the first housing piece 12 relative to the second housing piece 14, as discussed above between the staged configuration and the mated configuration. With reference to FIGS. 15-17, the enclosure 10 includes the first housing piece 12, the second housing piece 14, the sealant 62, the projections 66, and the first channel 70, as discussed above. With reference to FIGS. 15 and 17, the enclosure 10 also includes the second channel 64 as discussed above. With reference to FIG. 16, the enclosure 10 also includes the air gap 96 discussed above. With reference to FIGS. 15-17, the degree of compression of the sealant 62 increases progressively from the configuration shown in FIG. 15 to the configuration shown in FIG. 16 to the configuration shown in FIG. 17.

FIGS. 18-30 show another enclosure 210 in accordance with the principles of the present disclosure. The enclosure 210 includes a first housing piece 212 (e.g., a base) and a second housing piece 214 (e.g., a cover) that are pivotally connected to one another by a hinge arrangement 216. The hinge arrangement 216 allows the first housing piece 212 to pivot relative to the second housing piece 214 about an axis A. In one example, the hinge arrangement 216 includes two hinge locations 217 each located adjacent to a corner of the enclosure 210. The enclosure 210 also includes clamping elements 219 that are separate from the hinge locations 217 and are adapted for clamping and retaining the first and second pieces 212, 214 in a fully closed, sealed and mated configuration. The clamping elements 219 can be positioned about a perimeter of the enclosure 210. For example, clamping elements 219 can be provided on a side 221 of the enclosure 210 which corresponds to the hinge arrangement 216 and also can be provided on a side 223 of the enclosure 210 that is opposite from the hinge arrangement 216. While not shown, in certain examples, clamping elements 219 can also be provided along the sides of the enclosure 210 that extend between the sides 221, 223.

Figure 18:
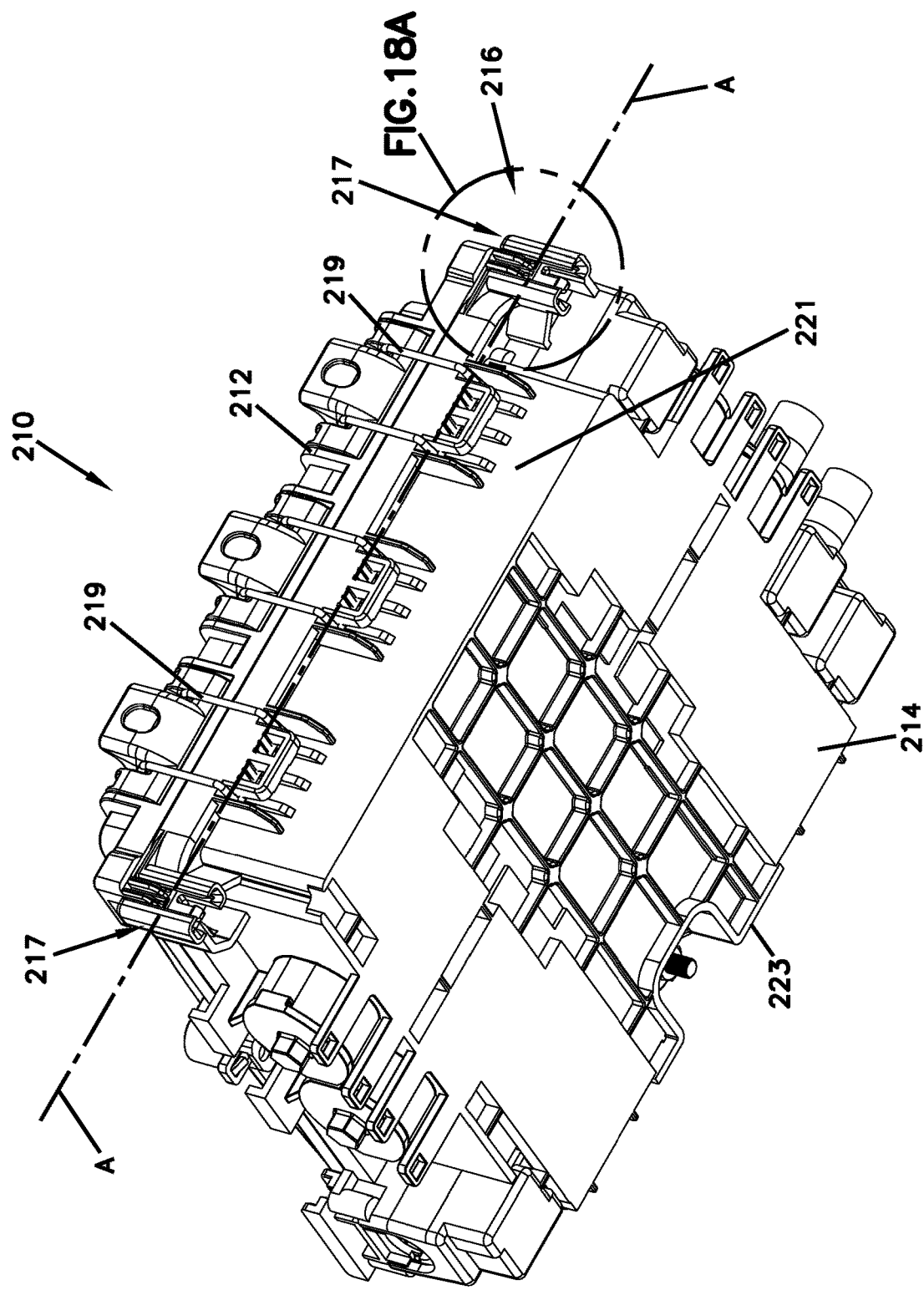
FIG. 18 is a perspective view of another example enclosure in accordance with the principles of the present disclosure.
Figure 18A:
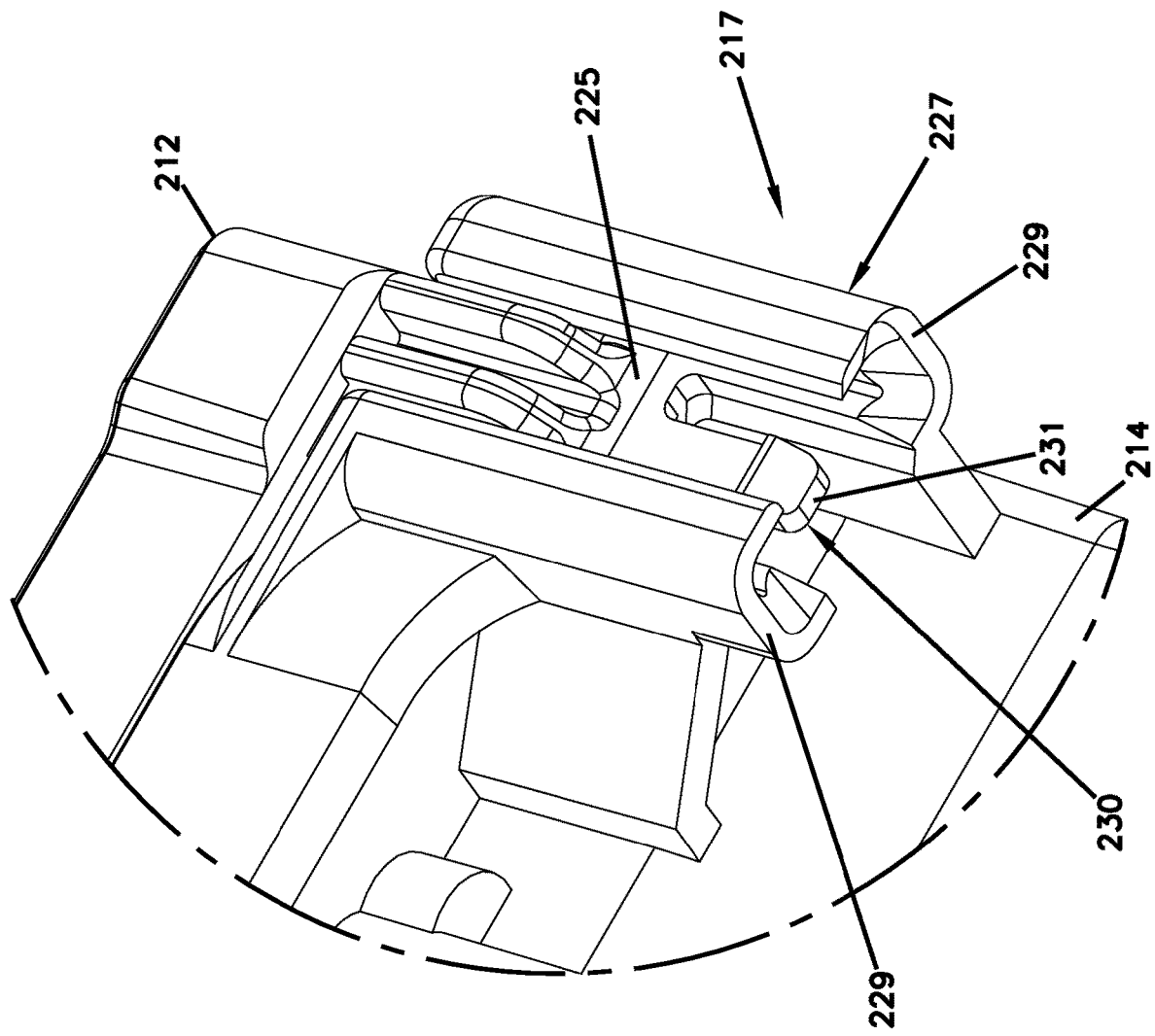
FIG. 18A is an enlarged, detailed view of a sliding hinge arrangement of the enclosure of FIG. 18.
Figure 19A:
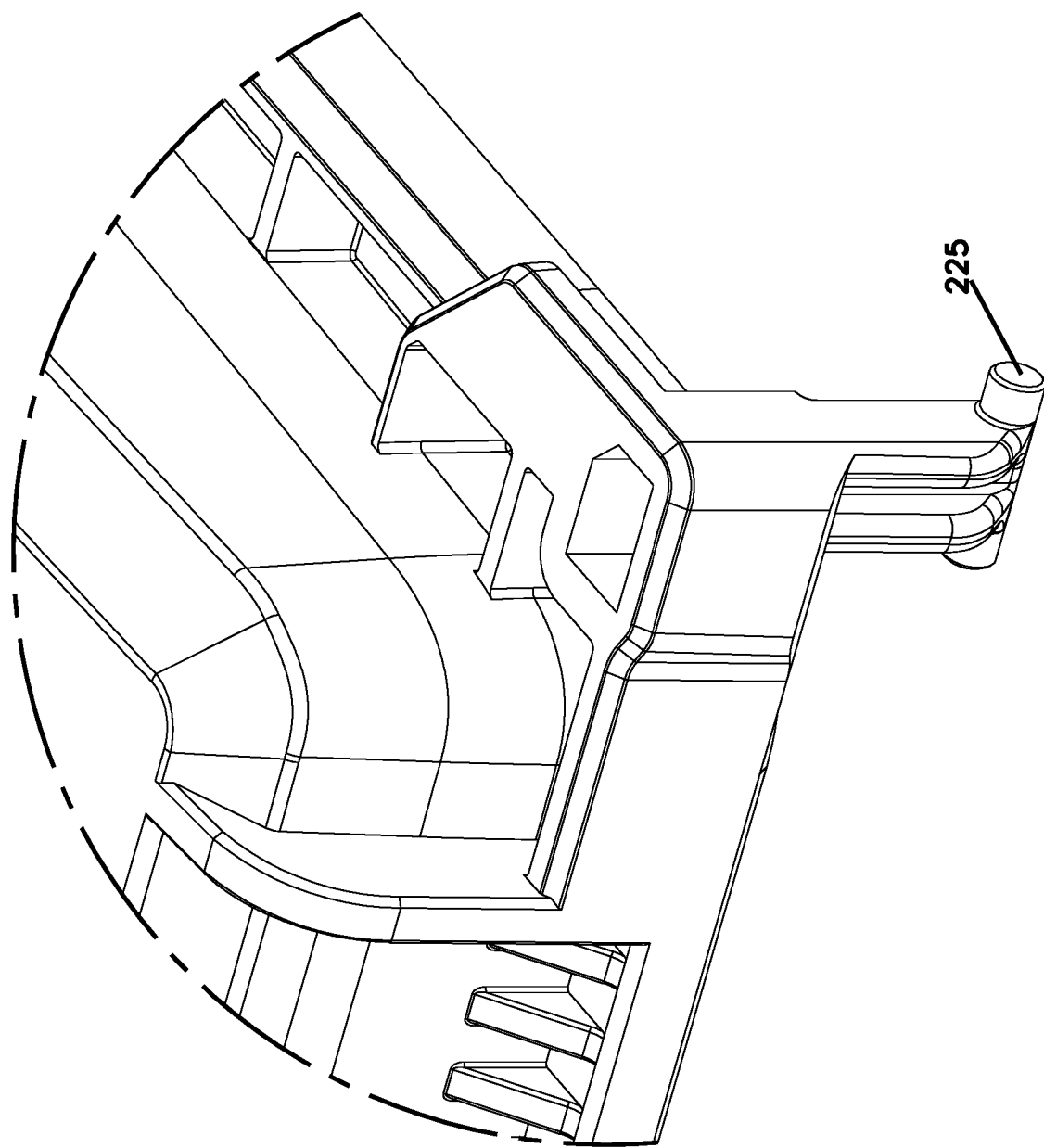
FIG. 19A is an enlarged, detailed view of a hinge pin of the cover of FIG. 19.
Figure 20:
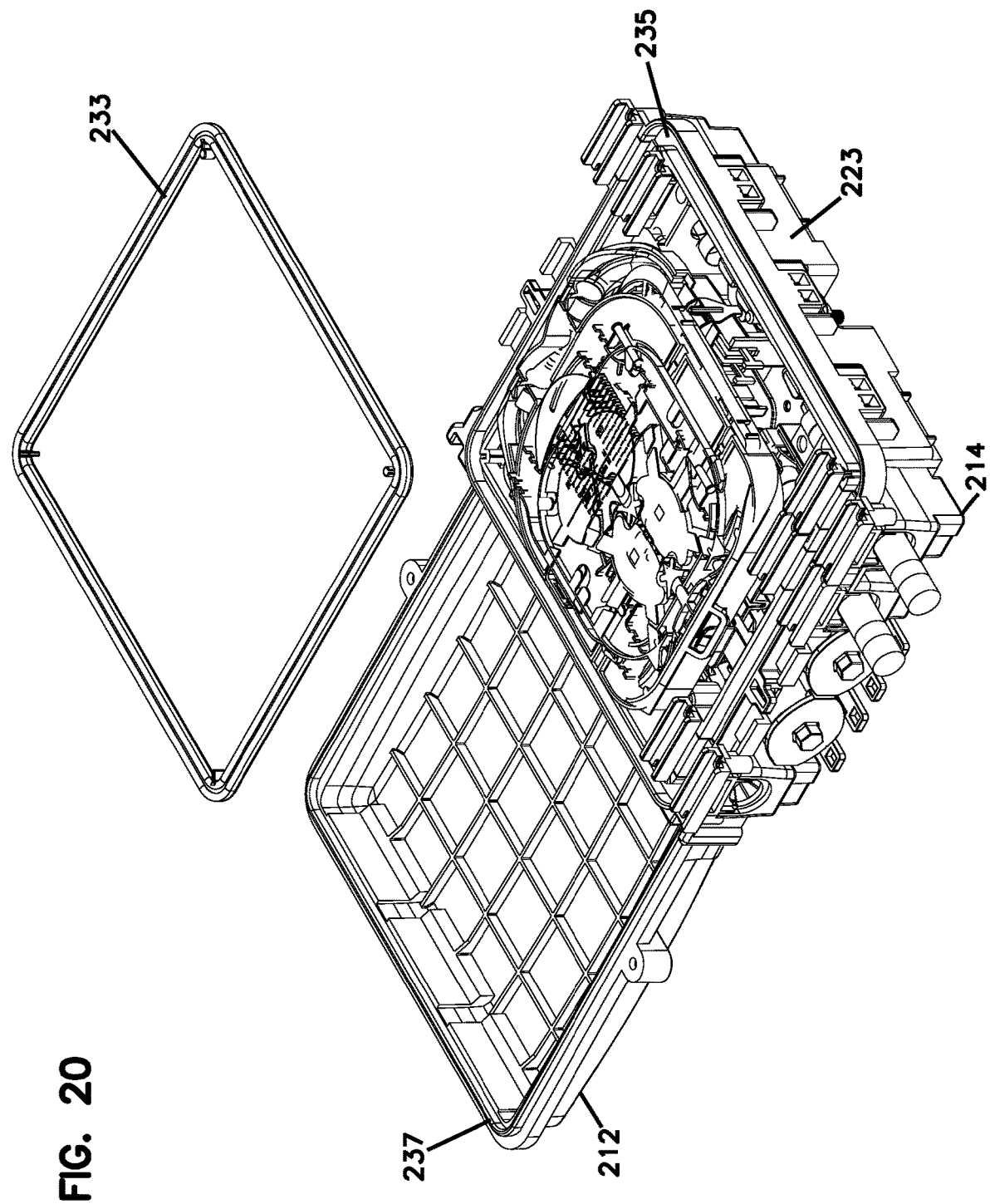
FIG. 20 shows the enclosure of FIG. 18 in an open position with a perimeter seal exploded from the enclosure.

The hinge arrangement 216 of the enclosure 210 is configured to allow the first and second pieces 212, 214 to pivot relative to one another about axis A between an open and closed configuration. FIG. 18 shows enclosure 210 in the closed configuration while FIG. 20 shows the enclosure 210 in the open configuration. The hinge arrangement 216 also allows the first and second housing pieces 212, 214 to slide relative to one another. In the depicted example, each hinge location 217 includes a hinge pin 225 (best shown at FIG. 19) integrated with the first housing piece 212 and a hinge pin receiver 227 (best shown at FIG. 18A) integrated with the second housing piece 214. The hinge pin receiver 227 defines a slide track formed by opposing slide channels 229. Ends of the hinge pin 25 are received within the slide channels 229. The slide channels 229 are configured to allow the hinge pin 225 to slide relative to the hinge pin receiver 227 such that the first housing piece 212 can be translated relative to the second housing piece 214 without requiring disconnection of the hinge pin 225 from the hinge pin receiver 227. A snap-fit configuration 231 retains the hinge pin 225 within the hinge pin receiver 227. The snap-fit arrangement 230 can include an elastic cantilever 231 that flexes to allow insertion of the hinge pin 225 into the hinge pin receiver 227, and then elastically returns to a retaining position where the cantilever 231 interferes with the hinge pin 225 to prevent the hinge pin 225 from being removed from the slide channels 229. If it is desired to remove the hinge pin 225 from the hinge pin receiver 227, the cantilever 231 can be manually flexed to a non-retaining position such that the hinge pin 225 can be slid outwardly from the hinge pin receiver 227.

As shown at FIG. 20, the enclosure 210 can include a perimeter seal 233 for providing environmental sealing at a sealing interface between the first and second housing pieces 212, 214 when the enclosure 210 is in the mated, closed configuration. In certain examples, the perimeter seal 233 can seat within a channel 235 defined by the second housing piece 214. In certain examples, the first housing piece 212 can include a projection 237 that presses the perimeter seal 233 into the channel 235 when the enclosure 210 is closed. In certain examples, the perimeter seal 233 can have an H-shaped transverse cross-sectional profile when not compressed (see FIGS. 23 and 25).

To most effectively compress the perimeter seal 233, it is desirable for the first housing piece 212 to translate toward the second housing piece 214 as the perimeter seal 233 is compressed without being pivotally moved. This type of movement is made possible by the configuration of the hinge arrangement 216 which permits both translational and pivotal movement between the first and second housing pieces 212, 214.

Figure 21:
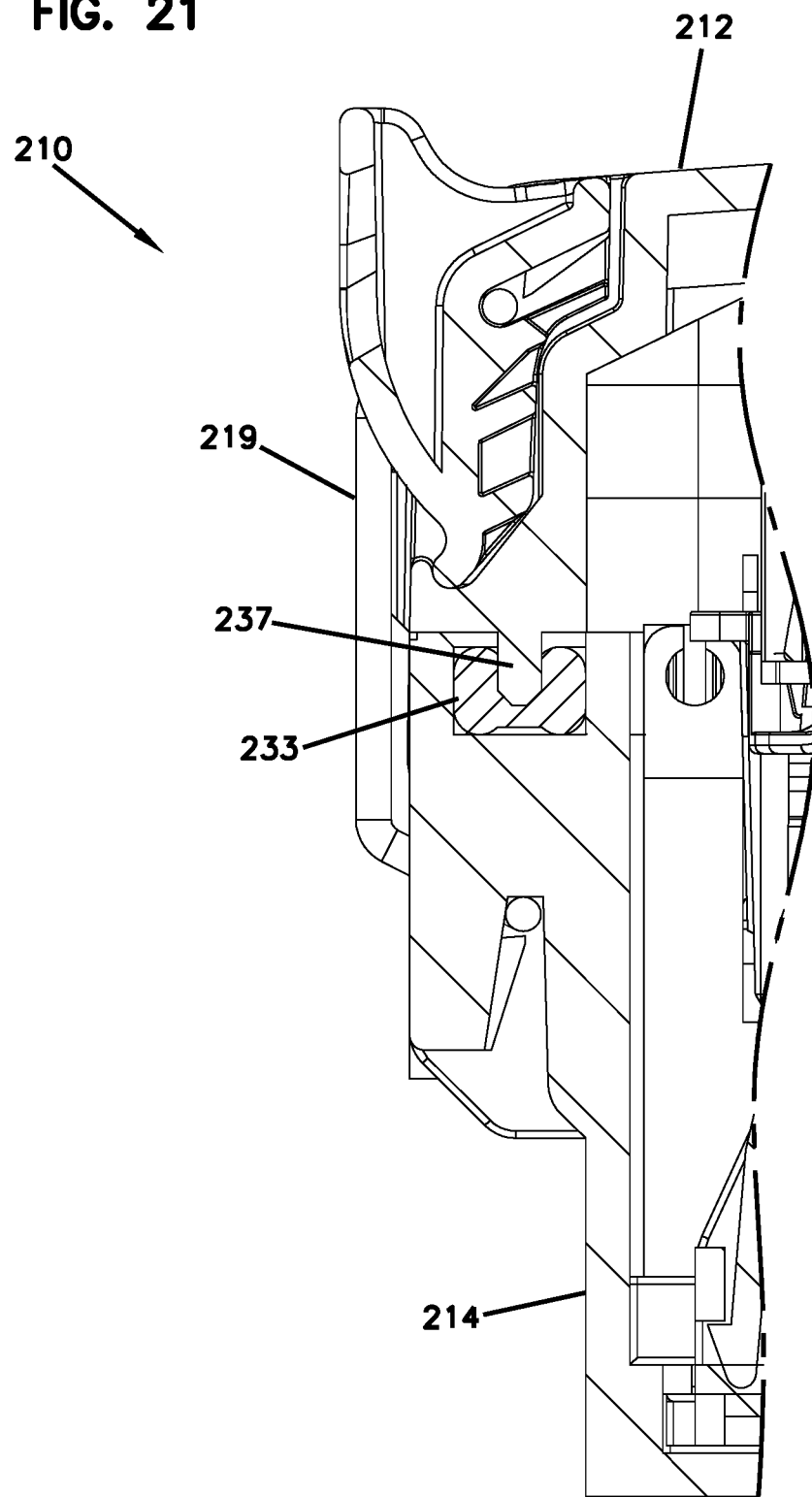
FIG. 21 is a partial cross-sectional view of the enclosure of FIG. 18 in a mated configuration in which the cover is clamped closed relative to the base.
Figure 22:
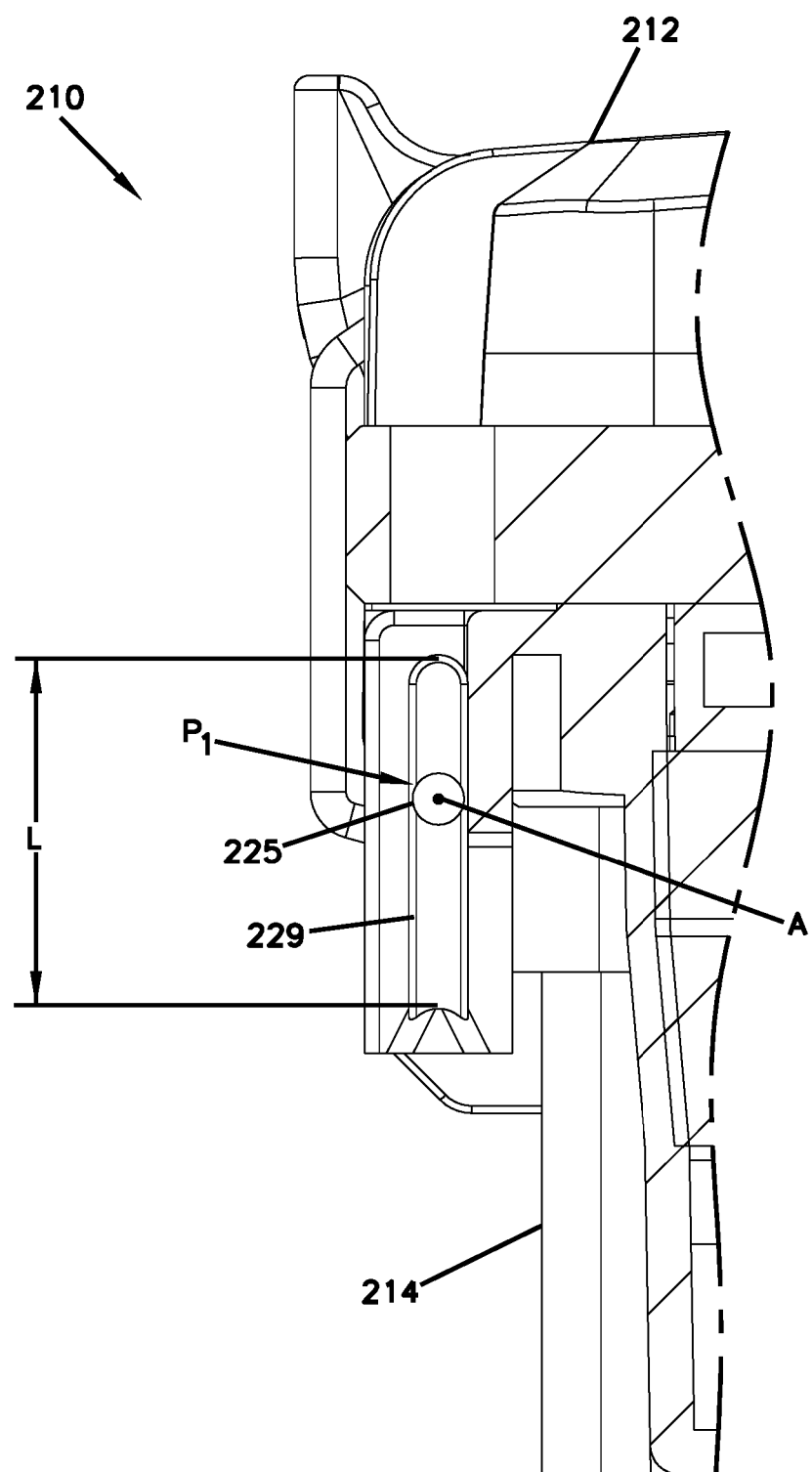
FIG. 22 is a partial cross-sectional view of the enclosure of FIG. 18 showing the hinge pin location relative to the base when the cover and the base are mated together and clamped closed.

FIGS. 21-30 are partial cross-sectional views showing the enclosure 210 in various configurations. FIGS. 21 and 22 show the enclosure 210 in a fully closed, sealed and mated configuration in which the perimeter seal 233 is compressed within the channel 235 by the projection 237 of the first housing piece 212. In the closed position of FIGS. 21 and 22, the first housing piece 212 has been pivoted closed and translated down relative to the second housing piece 214. The hinge pin 225 is at a first position P1 along a length L of the slide channels 229 of the hinge pin receiver 227.

Figure 23:
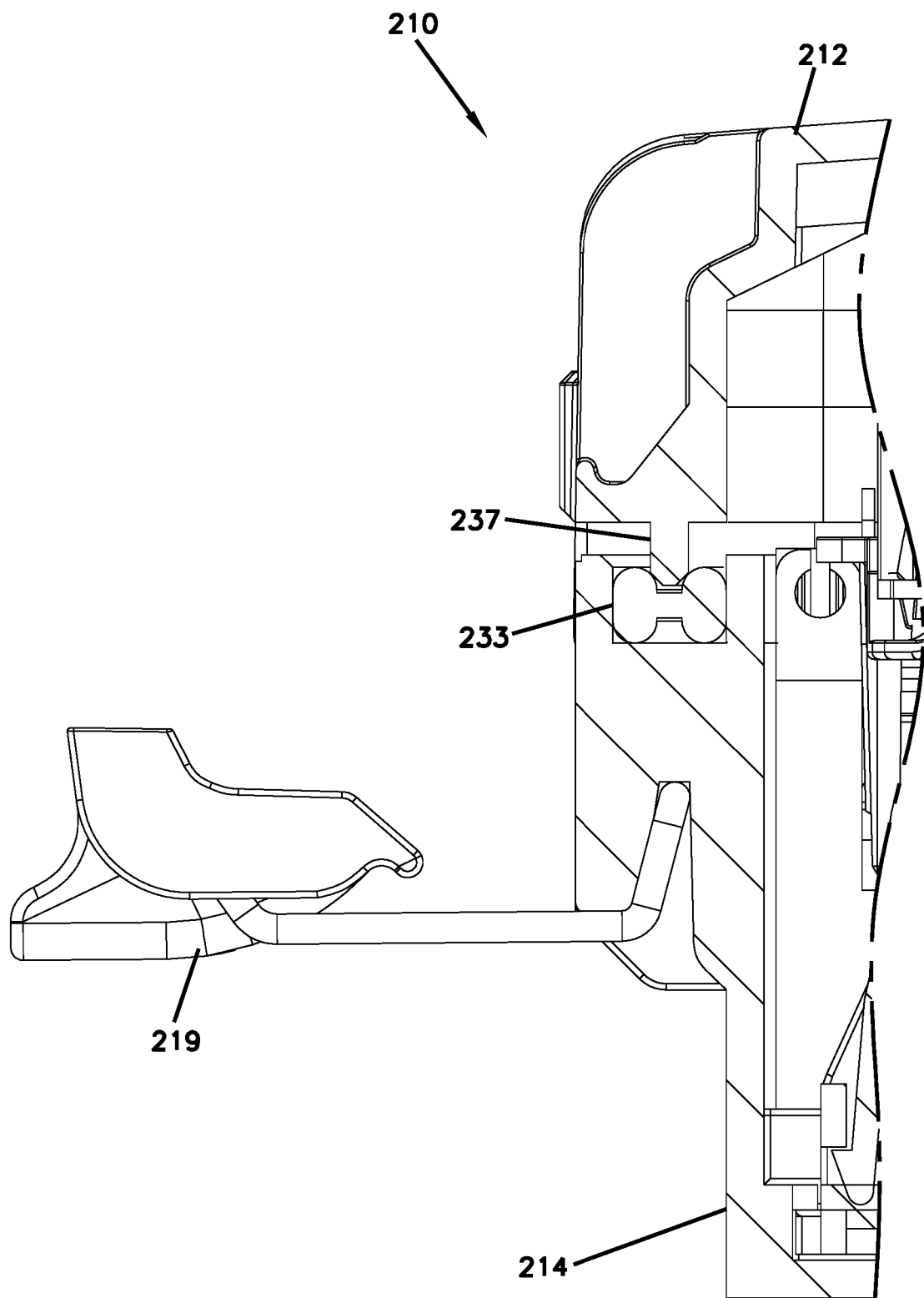
FIG. 23 is a partial cross-sectional view of the enclosure of FIG. 18 showing the cover in a staged configuration relative to the base.
Figure 24:
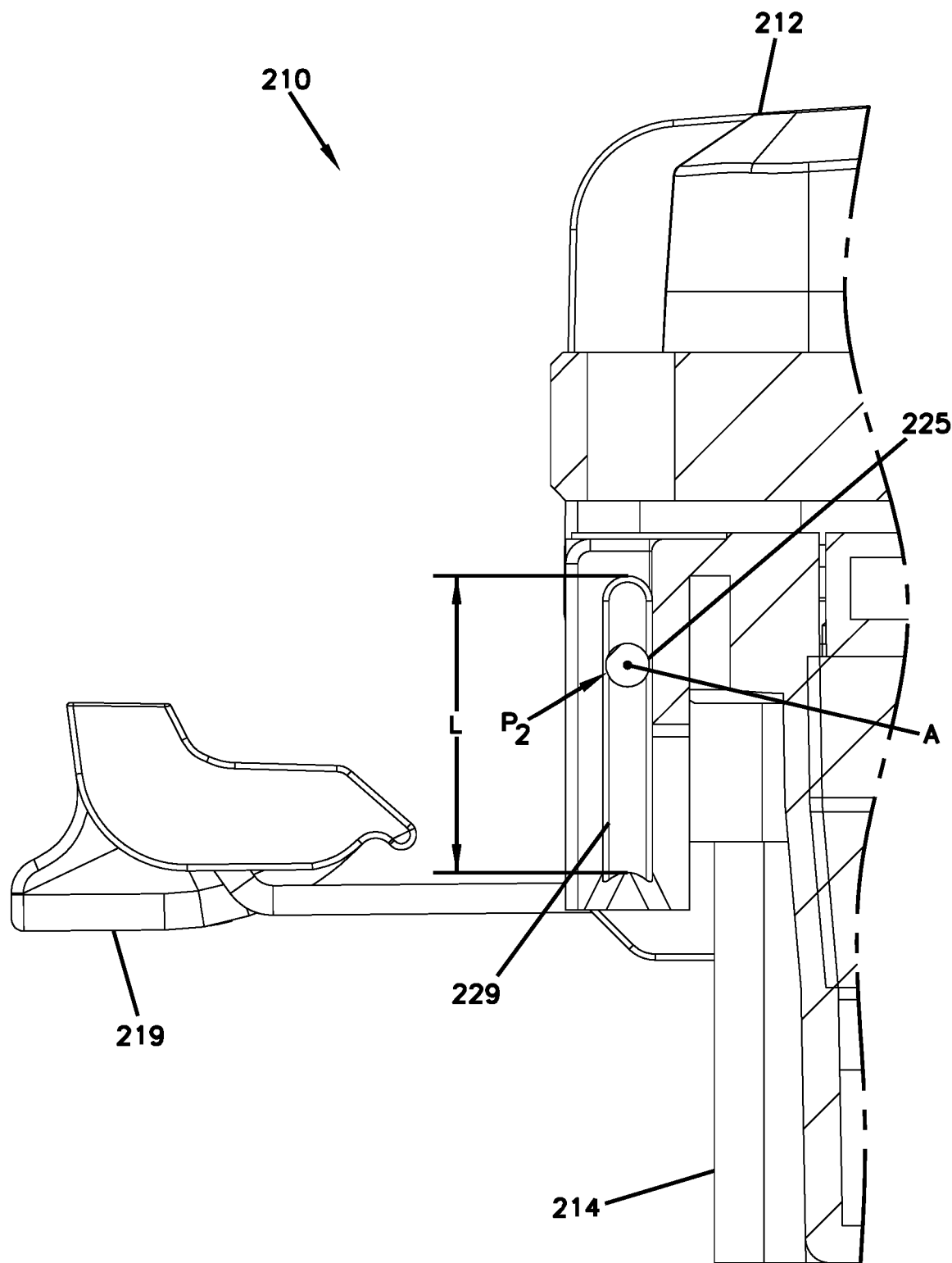
FIG. 24 is a partial cross-sectional view showing the hinge pin location relative to the base when the cover is in the staged configuration relative to the base.

FIGS. 23 and 24 show the enclosure 210 in a staged configuration in which the first housing piece 212 has been pivoted closed but is staged above the second housing piece 214 such that the perimeter seal 233 has not been compressed. To move the enclosure 210 between the fully mated and closed configuration of FIGS. 21 and 22 and the staged configuration of FIGS. 23 and 24, the first housing piece 212 is translated relative to the second housing piece 214. In the staged configuration of FIGS. 23 and 24, the hinge pin 225 is located at a second position P2 along the length L of the slide channels 229 of the hinge pin receiver 227. The position P2 corresponding to the staged configuration is elevated relative to the position P1 corresponding to the fully closed and mated configuration.

Figure 25:
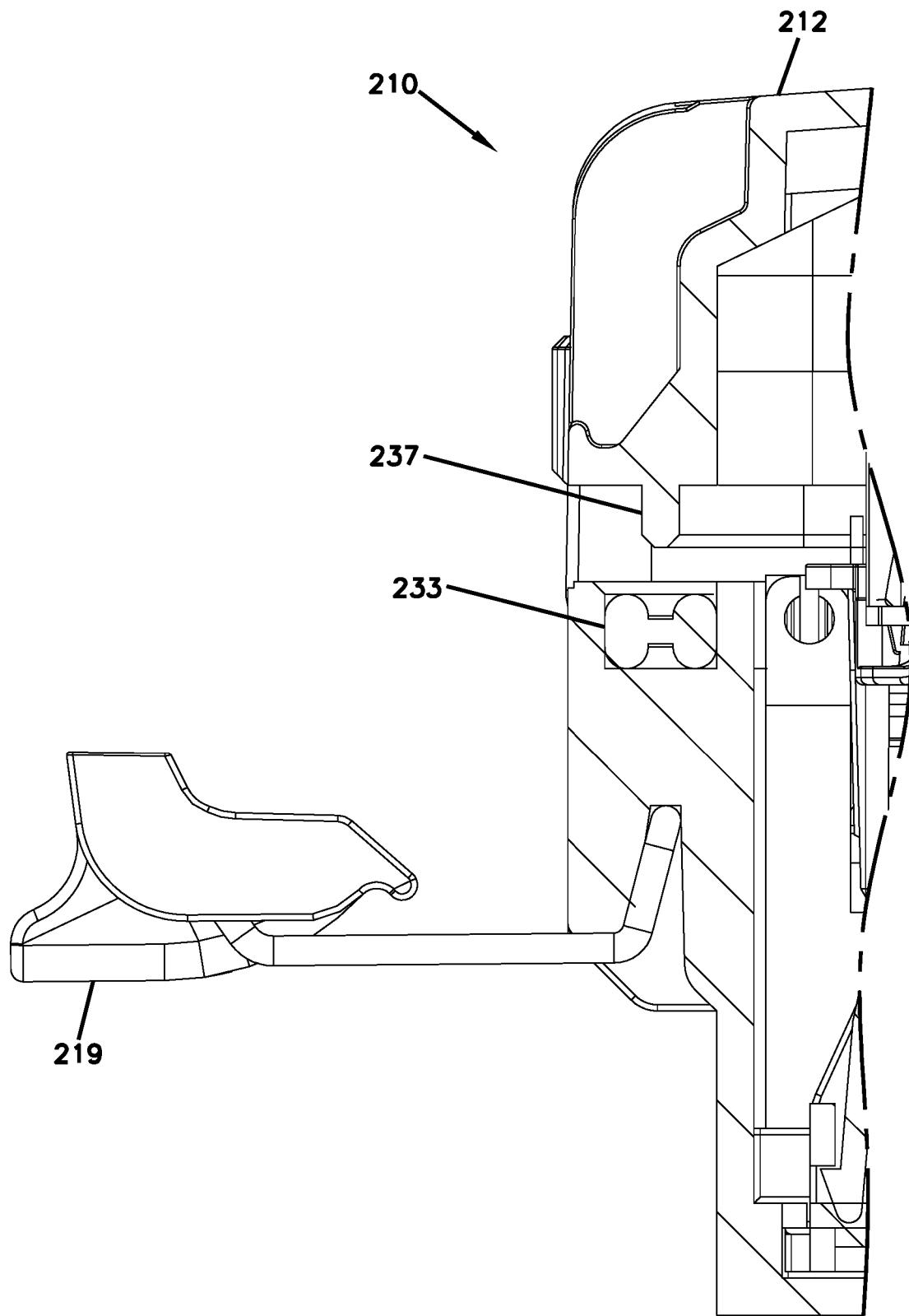
FIG. 25 is a partial cross-sectional view of the enclosure of FIG. 18 with the cover in an elevated configuration relative to the base.
Figure 26:
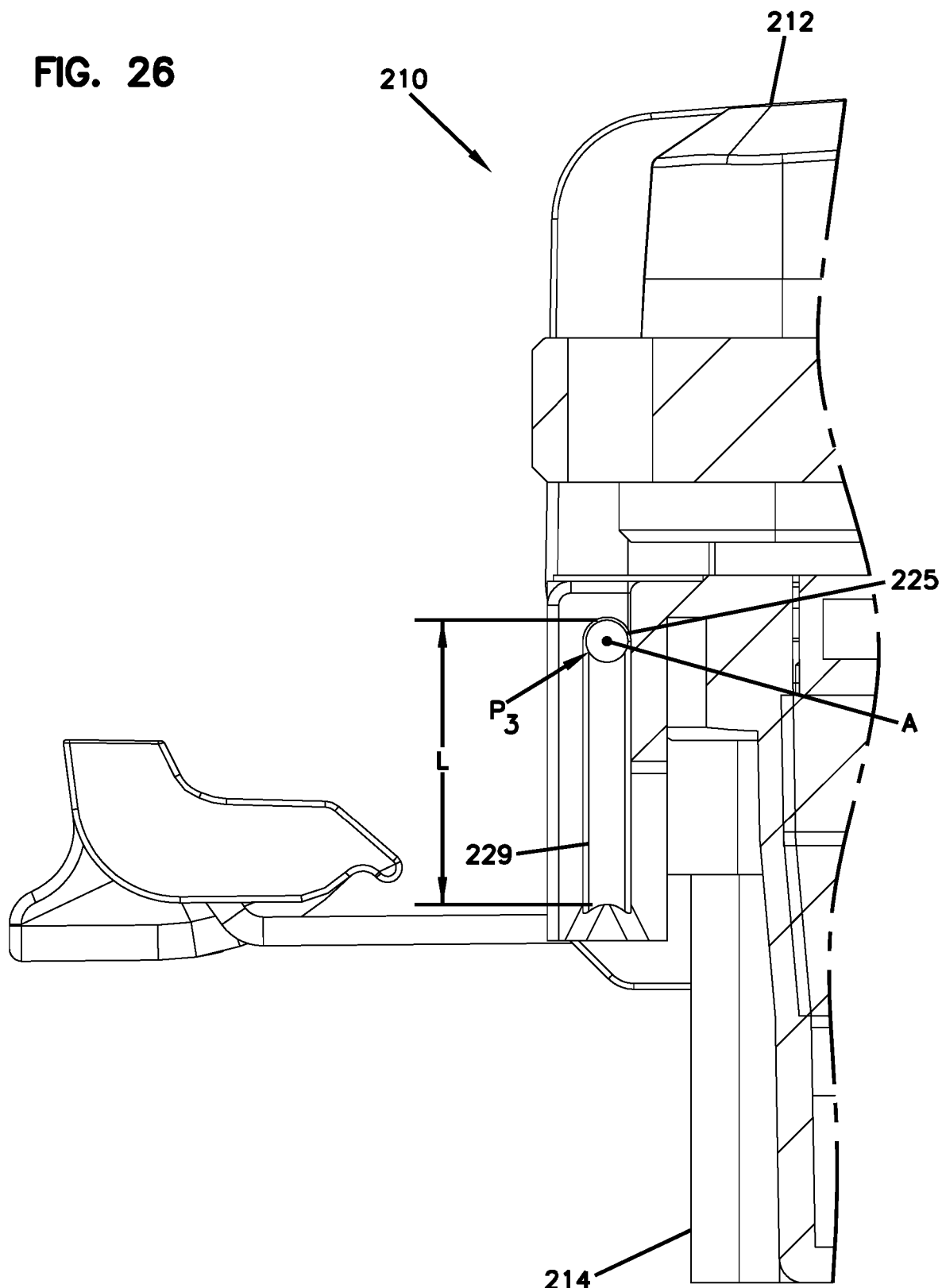
FIG. 26 is a partial cross-sectional view of the enclosure of FIG. 18 showing the location of the hinge pin relative to the base when the cover is in the elevated configuration relative to the base.

FIGS. 25 and 26 are partial cross-sectional views of the enclosure 210 showing the first housing piece 212 further elevated relative to the second housing piece 214. The first housing piece 212 is still pivoted to a closed position but has been translated relative to the second housing piece 214 such that a gap exists between the first and second housing pieces 212, 214. In the elevated position of FIGS. 25 and 26, the hinge pin 225 is positioned at a third position P3 along the length L of the slide channels 229 of the hinge pin receiver 227. The third position P3 is elevated relative to the second position P2 and is located directly at an upper end of the slide channels 229.

Figure 27:
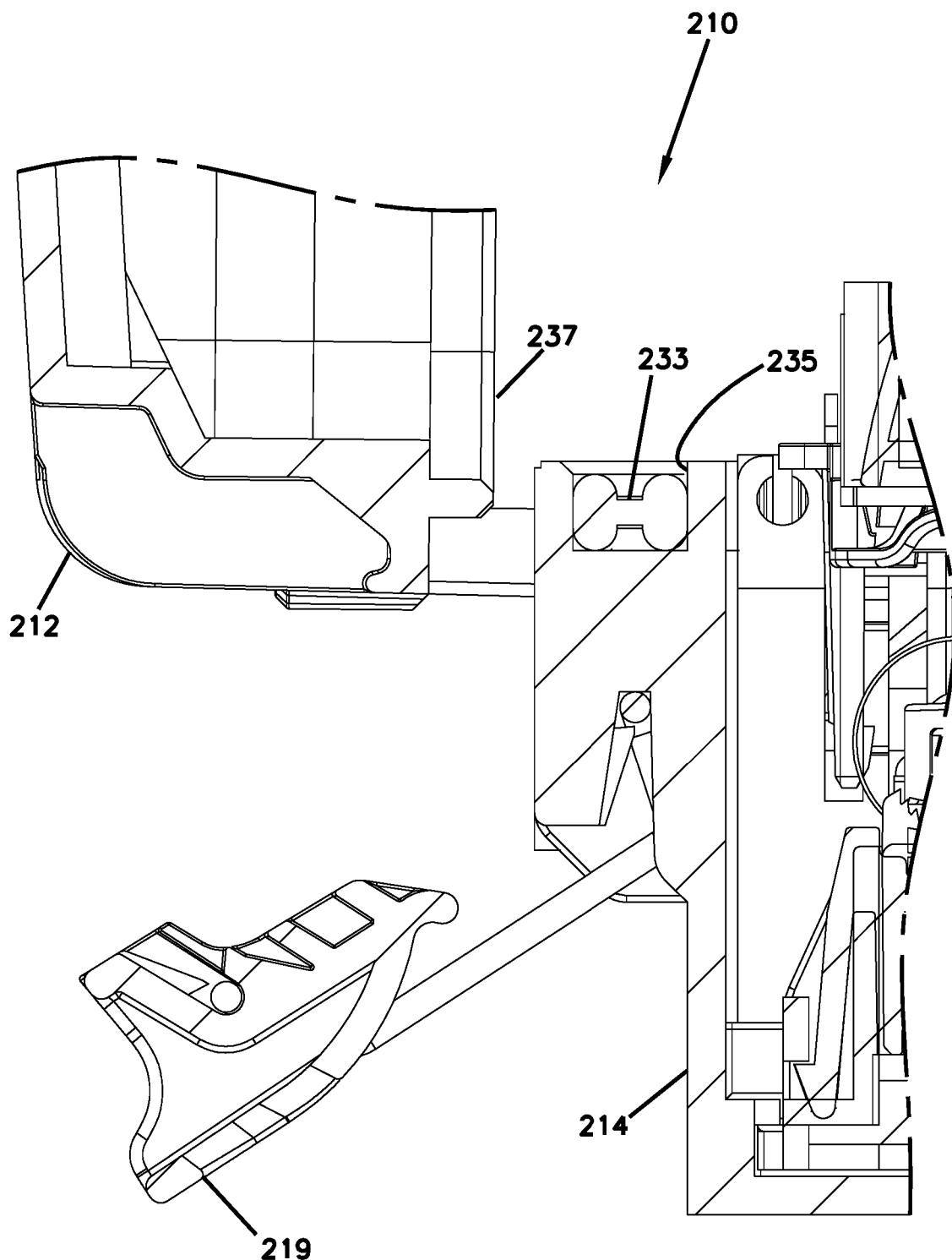
FIG. 27 is a partial cross-sectional view of the enclosure of FIG. 18 with the cover pivoted open relative to the base.
Figure 28:
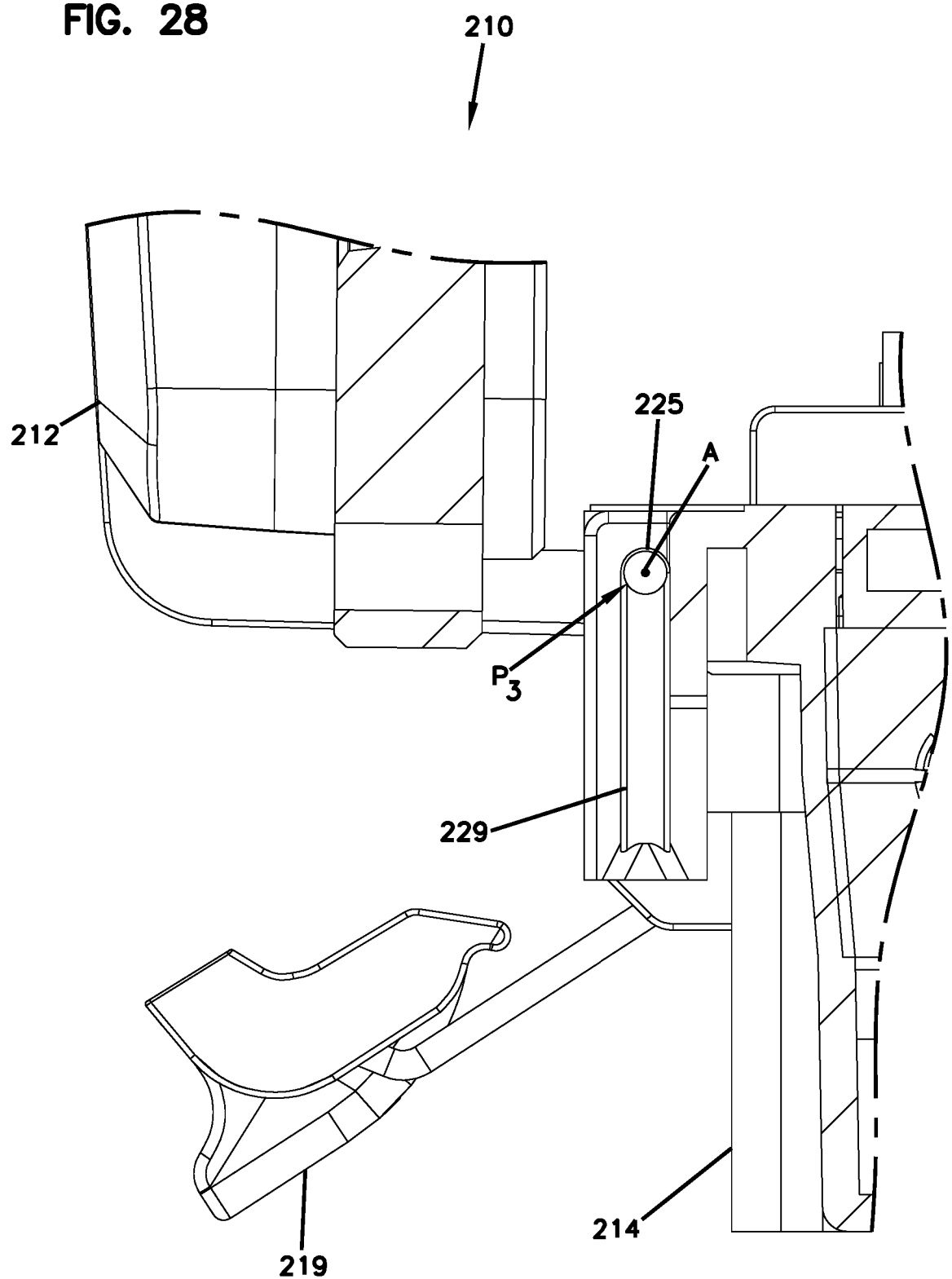
FIG. 28 is a partial cross-sectional view of the enclosure of FIG. 18 showing the hinge pin location relative to the base when the cover is pivoted to the position of FIG. 27.

FIGS. 27 and 28 are partial cross-sectional views of the enclosure 210 showing the first housing piece 212 pivoted relative to the second housing piece 214 while remaining elevated relative to the second housing piece 214 such that the hinge pin 225 remains in the third position P3.

Figure 29:
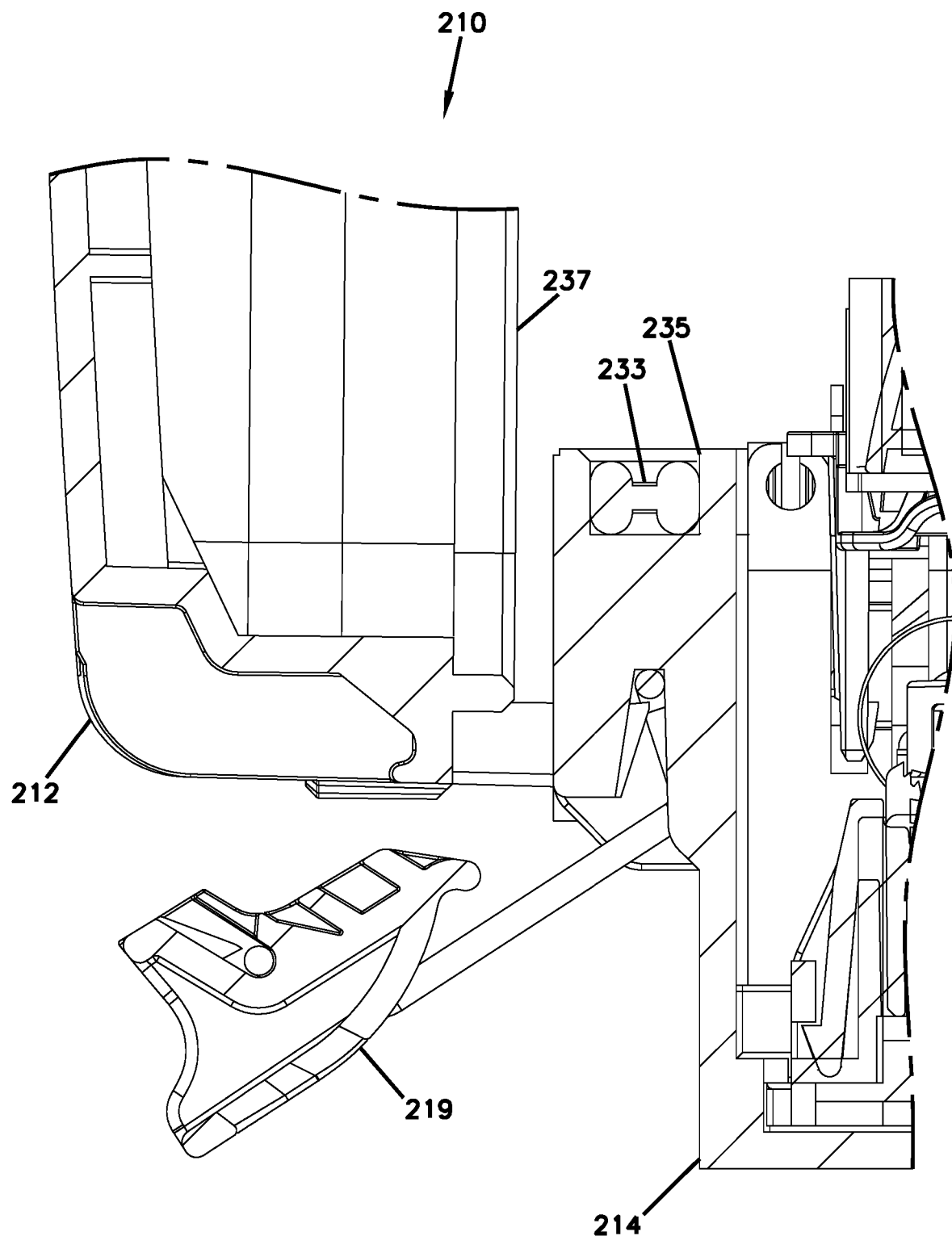
FIG. 29 is a partial cross-sectional view of the enclosure of FIG. 18 with the cover pivoted open and the hinge pin slid down relative to the base.
Figure 30:
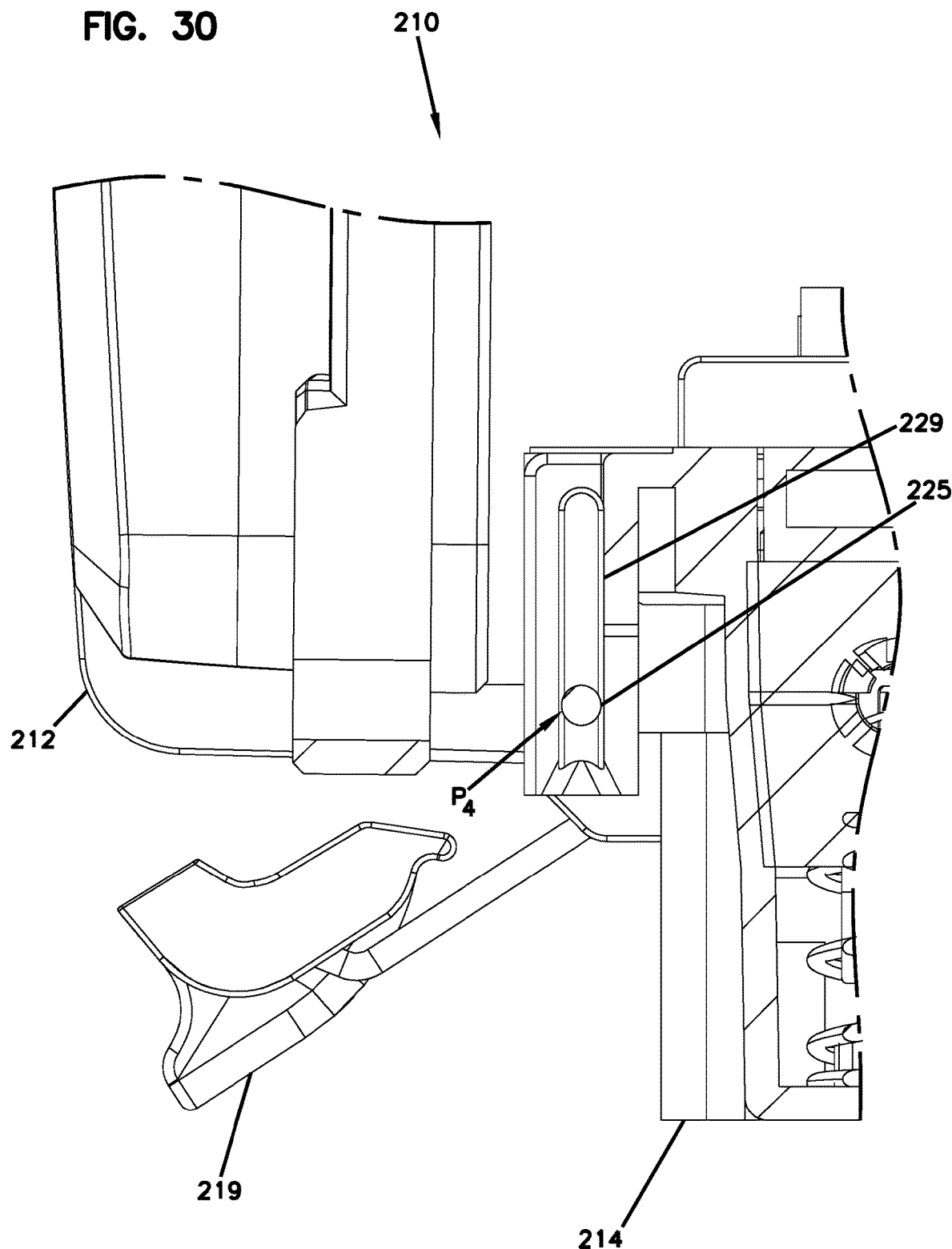
FIG. 30 is a partial cross-sectional view of the enclosure of FIG. 18 showing the hinge pin location relative to the base when the cover is slid down relative to the base to the position of FIG. 29.

FIGS. 29 and 30 are partial cross-sectional views of the enclosure 210 showing the second housing piece 212 pivoted open and slid downwardly relative to the second housing piece 214. In the configuration of FIGS. 29 and 30, the hinge pin 225 is located at a fourth position P4 located adjacent lower ends of the slide channels 229 of the hinge pin receiver 227. The fourth position P4 is located lower than the first position P1.

In the depicted example, the hinge pins 225 have been provided on the first housing piece 212 and the hinge pin receiver 227 has been provided on the second housing piece 214. In another example embodiment, the hinge pins 225 can be provided on the second housing piece 214 and the hinge pin receivers 227 can be provided on the first housing piece 212.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. An enclosure comprising:
   first and second housing pieces that cooperate to define an enclosed interior of the enclosure, the first and second housing pieces mating at an interface that extends at least substantially about a perimeter of the enclosure;
   a perimeter seal that extends at least substantially about the perimeter of the enclosure at the interface between the first and second housing pieces;
   the first and second housing pieces being pivotally connected by a hinge, the hinge including a pivot portion that engages the first housing piece and defines a hinge axis of the pivot portion, the pivot portion allowing relative pivotal movement about the hinge axis between the first and second housing pieces such that the enclosure can be pivoted between an open configuration and a staged configuration, the first and second housing pieces being oriented in registration with one another when the enclosure is in the staged configuration; and
   the enclosure being configured such that one of the first and second housing pieces can be translated toward the other of the first and second housing pieces to move the enclosure from the staged configuration to a mated configuration, the first and second housing pieces mating at the interface and the perimeter seal being compressed between the first and second housing pieces when the enclosure is in the mated configuration,
   wherein the hinge is configured such that the first housing piece translates without rotating relative to the hinge axis as the enclosure moves from the staged configuration to the mated configuration, and such that the hinge axis is stationary relative to the second housing piece when the enclosure moves from the staged configuration to the mated configuration.

2. The enclosure of claim 1, wherein the enclosure defines a plurality of sealed cable ports for allowing cables to be routed into the enclosed interior of the enclosure.

3. An enclosure comprising:
   first and second housing pieces that cooperate to define an enclosed interior of the enclosure, the first and second housing pieces mating at an interface that extends about a perimeter of the enclosure;
   a perimeter seal that extends about the perimeter of the enclosure at the interface between the first and second housing pieces; and
   an actuator for selectively compressing and decompressing at least a portion of the perimeter seal between the first and second housing pieces, the actuator including a pivot portion that engages the first housing piece and defines a hinge axis, the first housing piece being pivotally connected to the pivot portion such that the actuator can be pivoted about the hinge axis relative to the second housing piece to move the enclosure, without rotating the first housing piece relative to the hinge axis, between a closed configuration and a staged configuration in which the first and second housing pieces are oriented in registration with one another, and between the staged configuration and an open configuration, the second housing piece being mounted relative to the pivot portion such that the second housing piece is prevented from translating in position relative to the hinge axis as the enclosure moves between the staged and closed configurations, the actuator also including a cam portion that engages a reaction surface of the second housing piece when the actuator is pivoted relative to the first housing piece about the hinge axis to cause translational movement between the hinge axis and the first housing piece as the enclosure moves between the staged and closed configurations, wherein when the actuator is pivoted in a first direction about the hinge axis relative to the first housing piece the perimeter seal is compressed and when the actuator is pivoted in an opposite second direction about the hinge relative to the first housing piece the perimeter seal is decompressed.

4. The enclosure of claim 3, wherein the actuator includes a main body and a handle, wherein the main body is elongated along the hinge axis, and wherein the main body defines a plurality rotationally symmetric segments and a plurality rotationally asymmetric segments along the hinge axis.

5. The enclosure of claim 4, wherein the enclosure defines opposite first and second sides, wherein the actuator is a first actuator and is positioned at the first side of the enclosure, wherein the enclosure includes a second actuator positioned at the second side of the enclosure, the second actuator including a main body and a handle that projects from the main body, the main body being elongated along an actuation axis, the second actuator being pivotally movable about the actuation axis, and the main body including a plurality of rod housings spaced along the actuation axis for latching the first and second housing pieces together at the second side of the enclosure.

6. The enclosure of claim 5, wherein the second actuator is pivotally mounted to the second housing piece.

7. The enclosure of claim 6, wherein the enclosure has third and fourth opposite sides that extend between the first and second opposite sides, and wherein a retention mechanism is provided at the third side for securing the handles of the first and second actuators in orientations corresponding to actuated positions of the first and second actuators.

8. The enclosure of claim 7, wherein the first and second actuators can be moved from the actuated positions to non-actuated positions by releasing the retention mechanism and pivoting the first and second actuators to the non-actuated positions.

9. The enclosure of claim 1, wherein the enclosure includes a hinge arrangement, the hinge arrangement including the pivot portion, the pivot portion including hinge pins integrated with the second housing piece and hinge pin receivers integrated with the first housing piece, the hinge pin receivers being configured to receive the hinge pins, and the hinge pin receivers being configured to allow the hinge pins to pivot and slide relative to the hinge pin receivers.

10. The enclosure of claim 9, wherein the hinge pin receivers include opposing elongated channels that receive ends of the hinge pins, wherein the hinge pins can pivot within the channels about a pivot axis defined by the hinge pins, wherein the hinge pins can slide along lengths of the channels, and wherein the pivot axis moves along the lengths of the channels as the hinge pins slide along the lengths of the channels.

11. An enclosure defining an interior space comprising:
    a first housing piece;
    a second housing piece; and
    a hinge that pivotally couples the first housing piece to the second housing piece, the hinge comprising a barrel, a plurality of knuckles defining the barrel, each knuckle having an upper sleeve segment, a lower sleeve segment, and a ledge disposed between the upper sleeve segment and the lower sleeve segment, the hinge further comprising a cam having longitudinally alternating rotationally symmetric segments and rotationally asymmetric segments, the cam being disposed within the barrel such that at least one of the rotationally asymmetric segments is engageable with the ledge to provide translational movement of the first housing piece relative to the second housing piece, wherein each of the rotationally asymmetric segments comprises a base portion and a flange extending perpendicularly from the base portion; and wherein each of the rotationally symmetric segments comprises a plurality of radially projecting components, and wherein the flange and the base portion radially project further than the radially projecting components.

12. The enclosure of claim 11, wherein rotation of the cam causes both translational movement and rotational movement of the first housing piece relative to the second housing piece.

13. The enclosure of claim 11, wherein the second housing piece comprises a plurality of supports that house at least some of the rotationally symmetric segments of the cam.

14. The enclosure of claim 11, wherein each knuckle comprises first and second spacing elements between the upper sleeve segment and the lower sleeve segment.

15. The enclosure of claim 11, wherein the ledge is inclined relative to a plane on which a bottom of the enclosure rests.

16. The enclosure of claim 15, wherein the ledge projects into the barrel at an incline toward a top of the enclosure.

17. An enclosure comprising:

first and second housing pieces that cooperate to define an enclosed interior of the enclosure, the first and second housing pieces mating at an interface that extends about a perimeter of the enclosure;

a perimeter seal that extends about the perimeter of the enclosure at the interface between the first and second housing pieces, the perimeter seal being positioned within a first channel defined by opposing surfaces of the second housing piece, the first channel having an open side that faces toward the first housing piece when the first and second housing pieces are mated; and the first housing piece including first and second spaced-apart sealing projections that extend about the perimeter of the enclosure, the first and second sealing projections defining a second channel extending from the first sealing projection to the second sealing projection and that extends about the perimeter of the enclosure, the projections being configured to project into the perimeter seal within the first channel and to abut the opposing surfaces of the second housing piece when the first and second housing pieces are mated together, and wherein the perimeter seal compresses into the second channel when the first and second housing pieces are mated together.

18. The enclosure of claim 17, wherein an air gap exists between a compressed portion of the perimeter seal and a closed end of the second channel when the first and second housing pieces are mated together.

19. The enclosure of claim 17, wherein the sealing projections are tapered.

* * * * *